United States Patent
Tanigami et al.

(10) Patent No.: US 8,059,448 B2
(45) Date of Patent: Nov. 15, 2011

(54) SEMICONDUCTOR MEMORY DEVICE WITH VARIABLE RESISTANCE ELEMENTS

(75) Inventors: Hiroki Tanigami, Fukuyama (JP); Masahiro Saitoh, Fukuyama (JP); Takayuki Taniguchi, Kitakatsuragi-gun (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 12/440,207

(22) PCT Filed: Nov. 29, 2007

(86) PCT No.: PCT/JP2007/073023
§ 371 (c)(1),
(2), (4) Date: Mar. 5, 2009

(87) PCT Pub. No.: WO2008/072477
PCT Pub. Date: Jun. 19, 2008

(65) Prior Publication Data
US 2009/0161408 A1    Jun. 25, 2009

(30) Foreign Application Priority Data
Dec. 8, 2006 (JP) .................. 2006-332325

(51) Int. Cl.
*G11C 11/00* (2006.01)
*G11C 7/00* (2006.01)
(52) U.S. Cl. ................. 365/148; 365/189.16
(58) Field of Classification Search .......... 365/163, 365/159, 148, 158, 189.16
See application file for complete search history.

(56) References Cited

U.S. PATENT DOCUMENTS

| 6,888,773 | B2 * | 5/2005 | Morimoto | 365/218 |
|---|---|---|---|---|
| 7,057,922 | B2 * | 6/2006 | Fukumoto | 365/158 |
| 2004/0114438 | A1 | 6/2004 | Morimoto | |
| 2004/0264244 | A1 | 12/2004 | Morimoto | |
| 2005/0122768 | A1 | 6/2005 | Fukumoto | |
| 2005/0174854 | A1 | 8/2005 | Tsushima et al. | |

FOREIGN PATENT DOCUMENTS

| JP | 2002-170389 | 6/2002 |
|---|---|---|
| JP | 2004-185754 | 7/2004 |
| JP | 2005-025914 | 1/2005 |
| JP | 2005-092912 | 4/2005 |

(Continued)

OTHER PUBLICATIONS

Sawa et al., Applied Physics Letters, vol. 85, No. 18, Nov. 1, 2004, pp. 4073-4075.*

(Continued)

*Primary Examiner* — J. H. Hur
(74) *Attorney, Agent, or Firm* — Morrison & Foerster LLP

(57) ABSTRACT

A semiconductor memory device comprises a memory cell array including memory cells arranged in matrix each having a selective transistor and a variable resistance element having an electric resistance changed from a first state to a second state by applying a first write voltage and from the second state to the first state by applying a second write voltage. A first write current for a first writing operation to change the electric resistance from the first state to the second state is larger than a second write current for a second writing operation to change it from the second state to the first state. A second memory cell number of memory cells subjected to the second writing operation at a time is greater than a first memory cell number of memory cells subjected to the first writing operation at a time. At least the second memory cell number is plural.

12 Claims, 15 Drawing Sheets

FOREIGN PATENT DOCUMENTS

| | | |
|---|---|---|
| JP | 2005-216387 | 8/2005 |
| JP | 2006-120701 | 5/2006 |

OTHER PUBLICATIONS

International Search Report mailed Mar. 18, 2008, directed to counterpart PCT Application No. PCT/JP2007/073023; 2 pages.

Japanese Office Action mailed Mar. 7, 2008, directed to counterpart JP Application No. 2006-332325; 10 pages.

International Search Report mailed Mar. 18, 2008, directed to counterpart PCT Application No. PCT/JP2007/073023; 2 pages.

Japanese Office Action mailed Mar. 7, 2008, directed to counterpart JP Application No. 2006-332325; 10 pages.

\* cited by examiner

SEMICONDUCTOR MEMORY DEVICE WITH VARIABLE RESISTANCE ELEMENTS

CROSS-REFERENCE TO RELATED APPLICATIONS

This application is a National Phase filing under 35 U.S.C. §371 of International Application No. PCT/JP2007/073023 filed on Nov. 29, 2007, and which claims priority to Japanese Patent Application No. 2006-332325 filed on Dec. 8, 2006.

TECHNICAL FIELD

The present invention relates to a semiconductor memory device having a memory cell array in which memory cells each composed of a variable resistance element capable of storing information based on a change of electric resistance in response to voltage application, and a switching element are arranged in a row direction and a column direction.

BACKGROUND ART

A nonvolatile semiconductor memory device represented by a flash memory has been used widely in fields such as a computer, communication, a measurement instrument, an automatic control device and a living ware device used around individuals, and an inexpensive nonvolatile semiconductor memory device with a large capacity is highly required. This is mainly because the semiconductor memory device can be electrically written and has nonvolatile properties in which data is not erased even when a power supply is cut, and thereby can function as an readily portable memory card, a mobile phone and the like, or a data storage, a program storage and the like to be stored in a nonvolatile way as initial setting in a device operation.

In addition, some nonvolatile semiconductor memory devices using new materials have been disclosed recently, and a RRAM (Resistance Random Access Memory) is a promising one thereof. The RRAM fulfills its memory function by use of a variable resistance element in which a resistance thereof is changed when a current larger than a readout current is applied, and its possibility is expected because of its high potential such as a high speed, a large capacity, and low power consumption.

The following Patent Document 1 discloses a semiconductor memory device having one or more memory cell arrays in which nonvolatile memory cells each provided with a variable resistance element (resistance changing element) are arranged in a row direction and a column direction, and a plurality of word lines and a plurality of bit lines are arranged in the row direction and the column direction to select a certain memory cell or memory cell group from the above memory cells.

According to the above memory cell, one end of the variable resistance element to store information when an electric resistance thereof is changed is connected to a drain of a selective transistor, and in the memory cell array, one of the other end of the variable resistance element and a source of the selective transistor is commonly connected to the bit line in the column direction, and the other is commonly connected to a source line, and a gate of the selective transistor is commonly connected to the word line in the row direction. Erasing means is provided in such a manner that when voltages are applied to the word line, the bit line, and the source line connected in the memory cell array under a predetermined application condition, and the electric resistance of the variable resistance element in the memory cell to be erased in the memory cell array is set to a predetermined erased state, the information in the memory cell is erased. The erasing means is provided with a collective erasing mode in which all the memory cells in the memory cell array are collectively erased, and an individual erasing mode, in at least one memory cell array, so that writing speed is improved and data is efficiently used.

More specifically, since the erasing mode can be switched based on the voltage application condition such that when program data and the like are stored in the memory cells in the memory cell array and they are collectively written, the collective erasing mode is used, and when code data and the like are stored in the memory cells in the memory cell array and the code data is written individually, the individual erasing mode is used, the data can be efficiently used based on the characteristics of the data stored in the memory cells.

According to the above erasing means, all the memory cells in the memory cell array can be collectively erased when the voltage application condition is set to the collective erasing mode, in at least one memory cell array, and part of the memory cells in the memory cell array can be individually erased when the voltage application condition is set to the individual erasing mode, in at least another memory cell array, so that the collective erasing mode and the individual erasing mode can be switched with respect to each memory cell array. Thus, the memory cell array can be efficiently used based on the characteristics of the data stored in the memory cell.

Patent Document 1: Japanese Unexamined Patent Publication No. 2004-185754

DISCLOSURE OF THE INVENTION

However, according to the method disclosed in the above Patent Document 1, basic erasing means of a semiconductor memory device in which the variable resistance element is used in the memory cell is disclosed, and there is no consideration on an erase current in collective erasing. That is, although it is thought that the erase current in a circuit is increased in the collective erasing, there is no consideration on the realistic fact that as the erase current is increased, a large-sized boosting circuit (pump circuit) to be a supply source of the erase current is required in the circuit, so that a chip area is increased and a cost is increased.

When it is difficult to provide the large-sized boosting circuit in the circuit, it is necessary to supply the large erase current from an outside, so that a problem is that the supply of the erase current depends on the usage environment of the chip, and the usage range and the applied equipment of the semiconductor memory device are considerably limited.

The present invention was made to solve the above problem and it is an object of the present invention to provide a semiconductor memory device capable of writing data to memory cell array having a variable resistance element, at high speed and with low consumption current.

As a first aspect, a semiconductor memory device according to the present invention to achieve the above object comprises a memory cell array having memory cells each composed of a variable resistance element and a switching element, the variable resistance element having a two-terminal structure and storing information when an electric resistance is changed from a first state to a second state in response to application of a first write voltage applied to both ends and when the electric resistance is changed from the second state to the first state in response to application of a second write voltage applied to both ends, the switching element having one end electrically connected to one end of the variable resistance element, the memory cells being arranged in a row direction and in a column direction; and a writing unit configured to select one or more memory cells to be written from the memory cell array, and execute a first writing operation to change the electric resistance from the first state to the second state by applying the first write voltage to both ends of the variable resistance element of each of the selected memory cells and a second writing operation to change the electric resistance from the second state to the first state by applying the second write voltage to both ends of the variable resistance element of each of the selected memory cells, wherein the memory cells have write current characteristics in which a first write current flowing when the electric resistance is changed from the first state to the second state in response to the application of the first write voltage is larger than a second write current flowing when the electric resistance is changed from the second state to the first state in response to the application of the second write voltage, a second memory cell number, which is the maximum number of the memory cells where the second writing operation is executed by the writing unit at the same time, is greater than a first memory cell number, which is the maximum number of the memory cells where the first writing operation is executed by the writing unit at the same time, in one part or all of the memory cells in the memory cell array, and at least the second memory cell number of the first memory cell number and the second memory cell number is a plural number.

According to the semiconductor memory device having the first aspect, since an asymmetric property of the write current of the memory cell between the two writing operations is effectively used, that is, the second memory cell number of the memory cells where the second writing operation is executed at the same time is the plural number and greater than the first memory cell number of the memory cells where the first writing operation is executed at the same time, when the second writing operation having the smaller write current is executed at the same time on the memory cells more than that in the first writing operation, a writing time per memory cell can be efficiently shortened while the write current to be supplied at the same time is prevented from being increased. As a result, when data writing associated with the first writing operation and the second writing operation is performed for the certain number of memory cells in the memory cell array, a current supply source is prevented from being enlarged with respect to the memory cell array, and the writing time can be effectively shortened.

In addition, regarding the switching element, as long as the element can control the on/off of the current applied to the variable resistance element through the switching element by turning on and off the switching element, its terminal number, on/off control and an element structure are not limited to that of a specific switching element under the condition that it can be connected to the variable resistance element specifically.

Meanwhile, according to a flash memory as the representative of the conventional nonvolatile semiconductor memory device, although a collective erasing operation is performed under the condition that an erasing operation cannot be performed by the memory cell, according to the semiconductor memory device using the variable resistance element, each of the first writing operation and the second writing operation can be performed based on the memory cell, so that the data can be selectively written in a memory cell group required to be written. Thus, according to the semiconductor memory device of the present invention, since the data writing unit is not unnecessarily increased, the writing speed can be efficiently increased while current consumption for the minimum writing unit is suppressed.

Furthermore, as a second aspect, in addition to the first aspect according to the semiconductor memory device of the present invention, the second memory cell number is set to be not less than a write current ratio provided by dividing the first write current by the second write current.

According to the semiconductor memory device having the second aspect, a total write current when the second writing operation is performed for the second memory cell number of the memory cells at the same time is increased to be more than the first write current, up to a ceiling of a write current supply capability set to be more than the first write current when the first writing operation having the larger write current is performed for the memory cell. As a result, when the data writing associated with the first writing operation and the second writing operation is performed for the certain number of memory cells in the memory cell array, the execution number of the second writing operation can be maximally reduced and a writing time can be efficiently shortened as a whole.

Furthermore, as a third aspect, in addition to the first aspect, according to the semiconductor memory device of the present invention, when one of the first memory cell number and the second memory cell number is set to a predetermined value, a memory cell number ratio provided by dividing the second memory cell number by the first memory cell number is set such that a difference between the memory cell number ratio and a write current ratio provided by dividing the first write current by the second write current is minimized.

According to the semiconductor memory device having the third aspect, since a total write current when the first writing operation is performed for the first memory cell number of the memory cells at the same time and a total write current when the second writing operation is performed for the second memory cell number of the memory cells at the same time are almost equal to each other, the current consumption at the time of peak in the two writing operations can be uniform. As a result, when the two write currents are supplied from a common current supply source, the current can be supplied most efficiently.

Furthermore, as a fourth aspect, in addition to any one of the above aspects, according to the semiconductor memory device of the present invention, each of the first memory cell number and the second memory cell number is a plural number.

According to the semiconductor memory device having the fourth aspect, since the first memory cell number is also the plural number similar to the second memory cell number, when the data writing associated with the first writing operation and the second writing operation is performed for the certain number of memory cells in the memory cell array, the execution number of the first writing operation can be reduced and the whole writing time can be efficiently shortened.

Furthermore, as a fifth aspect, in addition to any one of the above aspects, according to the semiconductor memory device of the present invention, an absolute value of the first write voltage is greater than an absolute value of the second write voltage.

According to the semiconductor memory device having the fifth aspect, since the absolute value of the second write voltage required for the second writing operation to write more memory cell number at the same time is smaller than the absolute value of the first write voltage, power consumption when the second writing operation is performed for the second memory cell number of the memory cells at the same time can be suppressed.

Furthermore, as a sixth aspect, in addition to any one of the above aspects, according to the semiconductor memory device of the present invention, the switching element is a selective transistor composed of an MOSFET, and one end of the switching element electrically connected to one end of the variable resistance element is a source or a drain of the selective transistor.

According to the semiconductor memory device having the sixth aspect, since the switching element is the selective transistor composed of the MOSFET, it is well consistent with a present CMOS process, and this is preferable in view of the reduction in a development period and the simplicity of the circuit constitution.

As a seventh aspect, in addition to the sixth aspect, according to the semiconductor memory device of the present invention, the memory cell array has a plurality of word lines extending in the row direction and a plurality of bit lines extending in the column direction, a gate of the selective transistor of each of the memory cells in the same row is connected to a common word line, the other end, which is not connected to one of the source and drain of the selective transistor, of the variable resistance element in each of the memory cells in the same column, or the other of the source and drain, which is not connected to the one end of the variable resistance element, of the selective transistor in each of the memory cells in the same column is connected to a common bit line, the selective transistor is an N channel MOSFET, and when the first write voltage is applied to the memory cells to be written, a positive voltage is applied to the other end, which is not connected to the one of the source and drain of the selective transistor, of the variable resistance element in each of the memory cells to be written, based on the other of the source and drain, which is not connected to the one end of the variable resistance element, of the selective transistor in each of the memory cells to be written.

According to the semiconductor memory device having the seventh aspect, since the positive voltage is applied to the variable resistance element of the memory cell, the voltage applied to both ends of each of the memory cells to be written can be applied to both ends of the variable resistance element without being limited to a voltage value lowered from a gate voltage of the selective transistor by a threshold voltage. Thus, the first write voltage having an absolute value greater than that of the second write voltage can be applied to the variable resistance element efficiently, and the first writing operation can be executed efficiently.

Furthermore, as a eighth aspect, in addition to the seventh aspect, according to the semiconductor memory device of the present invention, the polarities of the first write voltage and the second write voltage are different, and when the second write voltage is applied to the memory cells to be written, a negative voltage is applied to the other end, which is not connected to the one of the source and drain of the selective transistor, of the variable resistance element in each of the memory cells to be written, based on the other of the source and drain, which is not connected to the one end of the variable resistance element, of the selective transistor in each of the memory cells to be written.

According to the semiconductor memory device having the eighth aspect, when the first write voltage and the second write voltage having the different polarities are applied to the variable resistance element, the first write voltage having the absolute value greater than that of the second write voltage can be applied without being limited to the voltage value lowered from the gate voltage of the selective transistor by the threshold voltage, and when the second write voltage having the absolute value smaller than that of the first write voltage is applied to the variable resistance element, the application is limited to the voltage value lowered from the gate voltage of the selective transistor by the threshold voltage. Thus, although it is necessary to apply the voltage having the absolute value greater than that of the second write voltage to the memory cell, since the absolute value of the second write voltage is smaller than that of the first write voltage originally, there is no large difference between the write voltages applied to both ends of the memory cells in the first writing operation and the second writing operation. Thus, when the variable resistance element or the selective transistor is appropriately designed, the write voltages to be applied to both ends of the memory cells in the first writing operation and the second writing operation can be designed to be the same voltage.

Furthermore, as a ninth aspect, in addition to any one of the above aspects, according to the semiconductor memory device of the present invention, the writing unit preliminarily executes the first writing operation to set the electric resistance to the second state uniformly before executing the second writing operation for the second memory cell number of the memory cells at the same time, based on previously incorporated write control procedures.

According to the semiconductor memory device having the ninth aspect, since the resistance values of the electric resistance of the memory cells in the second state to be subjected to the second writing operation are within a narrower range, the resistance values of the electric resistance in the second state after the second writing operation can be within a narrower range, and the resistance values of the electric resistance in the first state and the second state after the final writing operation can be within a narrower range, so that the operation margin in a reading operation and reading speed are improved.

In addition, as a tenth aspect, in addition to the ninth aspect, according to the semiconductor memory device of the present invention, the writing unit executes a reading operation for the second memory cell number of the memory cells to be subjected to the second writing operation at the same time before the preliminary first writing operation to extract the memory cell having the electric resistance not in the second state, and executes the preliminary first writing operation only for the extracted memory cell, based on the previously incorporated write control procedures.

According to the semiconductor memory device having the tenth aspect, since the memory cell number of the memory cells to be subjected to the preliminary first writing operation is limited to only the memory cell requiring the above first writing operation, the number of execution of the preliminary first writing operation can be reduced, and a time required for the preliminary first writing operation can be shortened, so that a total writing time can be shortened.

As a first aspect, a writing method of a semiconductor memory device according to the present invention to achieve the above object, the semiconductor memory device comprising a memory cell array having memory cells each composed of a variable resistance element and a switching element, the variable resistance element having a two-terminal structure and storing information when an electric resistance is changed from a first state to a second state in response to application of a first write voltage to both ends and when the electric resistance is changed from the second state to the first state in response to application of a second write voltage to both ends, the switching element having one end electrically connected to one end of the variable resistance element, the memory cells being arranged in a row direction and in a column direction, wherein the memory cells have write current characteristics in which a first write current flowing when the electric resistance is changed from the first state to the second state in response to the application of the first write voltage is larger than a second write current flowing when the electric resistance is changed from the second state to the first state in response to the application of the second write voltage, the method for writing information to one part or all of the memory cells in the memory cell array comprising at least: a first writing step for executing a first writing operation to change the electric resistance from the first state to the second state by applying the first write voltage to both ends of the variable resistance element, for at least a part of one or more memory cells to be written in the memory cell array; and a second writing step for executing a second writing operation to change the electric resistance from the second state to the first state by applying the second write voltage to both ends of the variable resistance element, for at least an other part of the memory cells to be written, wherein a second memory cell number, which is the maximum number of the memory cells where the second writing operation is executed at the same time in the second writing step is greater than a first memory cell number, which is the maximum number of memory cells where the first writing operation is executed at the same time in the first writing step, and at least the second memory cell number of the first memory cell number and the second memory cell number is a plural number.

According to the writing method of the semiconductor memory device having the first aspect, since an asymmetric property of the write current of the memory cell between the two writing operations is effectively used, that is, the second memory cell number of the memory cells where the second writing operation is executed at the same time is the plural number and greater than the first memory cell number of the memory cells where the first writing operation is executed at the same time, when the second writing operation having the smaller write current is executed on the memory cells more than that in the first writing operation at the same time, a writing time per memory cell can be efficiently shortened while the write current to be supplied at the same time is prevented from being increased. As a result, when data writing associated with the first writing operation and the second writing operation is performed for the certain number of memory cells in the memory cell array, a current supply source is prevented from being enlarged with respect to the memory cell array, and the writing time can be effectively shortened.

Furthermore, as a second aspect, in addition to the first aspect, according to the writing method of the semiconductor memory device of the present invention, the second memory cell number is set to be not less than a write current ratio provided by dividing the first write current by the second write current.

According to the writing method of the semiconductor memory device having the second aspect, a total write current when the second writing operation is performed for the second memory cell number of the memory cells at the same time is increased to be not less than the first write current, up to a ceiling of a write current supply capability set to be not less than the first write current when the first writing operation having the larger write current is performed based on the memory cell. As a result, when the data writing associated with the first writing operation and the second writing operation is performed for the certain number of memory cells in the memory cell array, the execution number of the second writing operation can be maximally reduced and a writing time can be efficiently shortened as a whole.

Furthermore, as a third aspect, in addition to the first aspect, according to the writing method of the semiconductor memory device of the present invention, when one of the first memory cell number and the second memory cell number is set to a predetermined value, a memory cell number ratio provided by dividing the second memory cell number by the first memory cell number is set such that a difference between the memory cell number ratio and a write current ratio provided by dividing the first write current by the second write current is minimized.

According to the writing method of the semiconductor memory device having the third aspect, since a total write current when the first writing operation is performed for the first memory cell number of the memory cells at the same time and a total write current when the second writing operation is performed for the second memory cell number of the memory cells at the same time are almost equal to each other, the current consumption at the time of peak in the two writing operations can be uniform. As a result, when the two write currents are supplied from a common current supply source, the current can be supplied most efficiently.

As a fourth aspect, in addition to any one of the above aspects, the writing method of the semiconductor memory device in the present invention further comprises a preliminary first writing step for executing the first writing operation preliminarily to set the electric resistance to the second state uniformly before the second writing step, wherein the preliminary first writing step, the second writing step, and the first writing step are executed sequentially based on previously incorporated write control procedures.

According to the writing method of the semiconductor memory device having the fourth aspect, since the resistance values of the electric resistance of the memory cells in the second state to be subjected to the second writing operation are within a narrower range, the resistance values of the electric resistance in the second state after the second writing operation can be within a narrower range, and the resistance values of the electric resistance in the first state and the second state after the final writing operation can be within a narrower range, so that the operation margin in the reading operation and the reading speed are improved.

In addition, as a fifth aspect, in addition to the fourth aspect, the writing method of the semiconductor memory device in the present invention further comprises a preliminary reading step for executing a reading operation for the second memory cell number of the memory cells to be subjected to the second writing operation at the same time before the preliminary first writing step to extract a memory cell having the electric resistance not in the second state, wherein the preliminary first writing operation is executed in the preliminary first writing step only for the memory cell extracted in the preliminary reading step.

According to the writing method of the semiconductor memory device having the fifth aspect, since the memory cell number to be subjected to the preliminary first writing operation is limited only to the memory cell requiring the above first writing operation, the number of execution of the preliminary first writing operation can be reduced, and a time required for the preliminary first writing operation is shortened, so that a total writing time can be shortened.

BEST MODE FOR CARRYING OUT THE INVENTION

Embodiments of a semiconductor memory device and a writing method thereof according to the present invention (hereinafter, occasionally referred to as "device of the present invention" and "method of the present invention") will be described with reference to the drawings hereinafter.

First Embodiment

Figure 1:
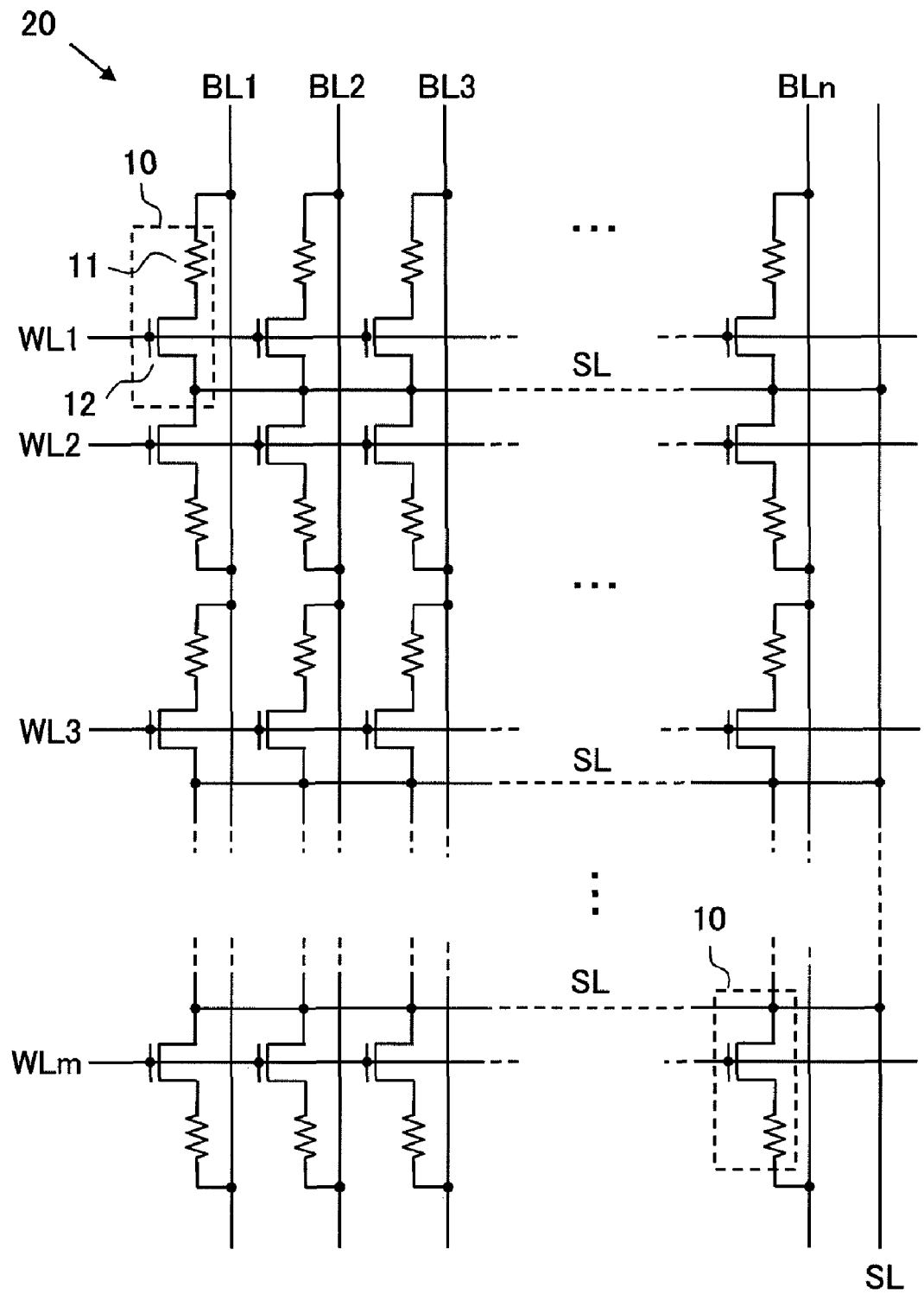
FIG. 1 is a circuit diagram schematically showing one constitution example of a memory cell array in one embodiment of a semiconductor memory device according to the present invention.

As shown in FIG. 1, the device of the present invention is provided with one or more memory cell arrays 20 in which a plurality of memory cells 10 are arranged in a row direction and a column direction, and a plurality of word lines WL1 to WLm and a plurality of bit lines BL1 to BLn are arranged in the row direction and the column direction to select the predetermined memory cell or memory cell group, and a source line SL extending in the row direction is arranged. In addition, although the source line SL extends in the row direction parallel to the word lines WL1 to WLm in each line, and connected to each other outside the memory cell array 20 in FIG. 1, one source line SL may be shared by the adjacent two rows, or it may extend in the column direction instead of the row direction. Furthermore, the plurality of source lines SL may be provided in one memory cell array 20 to select the predetermined memory cell or memory cell group similar to the word lines and the bit lines.

In addition, the memory cell array 20 is not limited to a constitution of an equivalent circuit shown in FIG. 1, so that as long as the memory cells 10 each having a variable resistance element 11 and a selective transistor 12 (one example of a switching element) are connected by the word lines and bit lines and source line to constitute the memory cell array, the device of the present invention is not limited to a specific circuit constitution in particular.

According to the present embodiment, the memory cell 10 forms a series circuit by connecting one end of the variable resistance element 11 to one of a source and a drain of the selective transistor 12, and the other end of the variable resistance element 11 is connected to one of the bit lines BL1 to BLn, the other of the source and the drain of the selective transistor 12 is connected to the source line SL, and a gate of the selective transistor 12 is connected to one of the word lines WL1 to WLm. The selective transistor 12 is an MOSFET that is same as the one used to constitute a peripheral circuit of the memory cell array 20 to be described later, and it is an enhancement type of N channel MOSFET in which a conductivity type of the source and the drain is an N type and its threshold voltage is a positive voltage (for example, +0.1 V to +1.0 V, preferably about +0.5 V).

Figure 2:
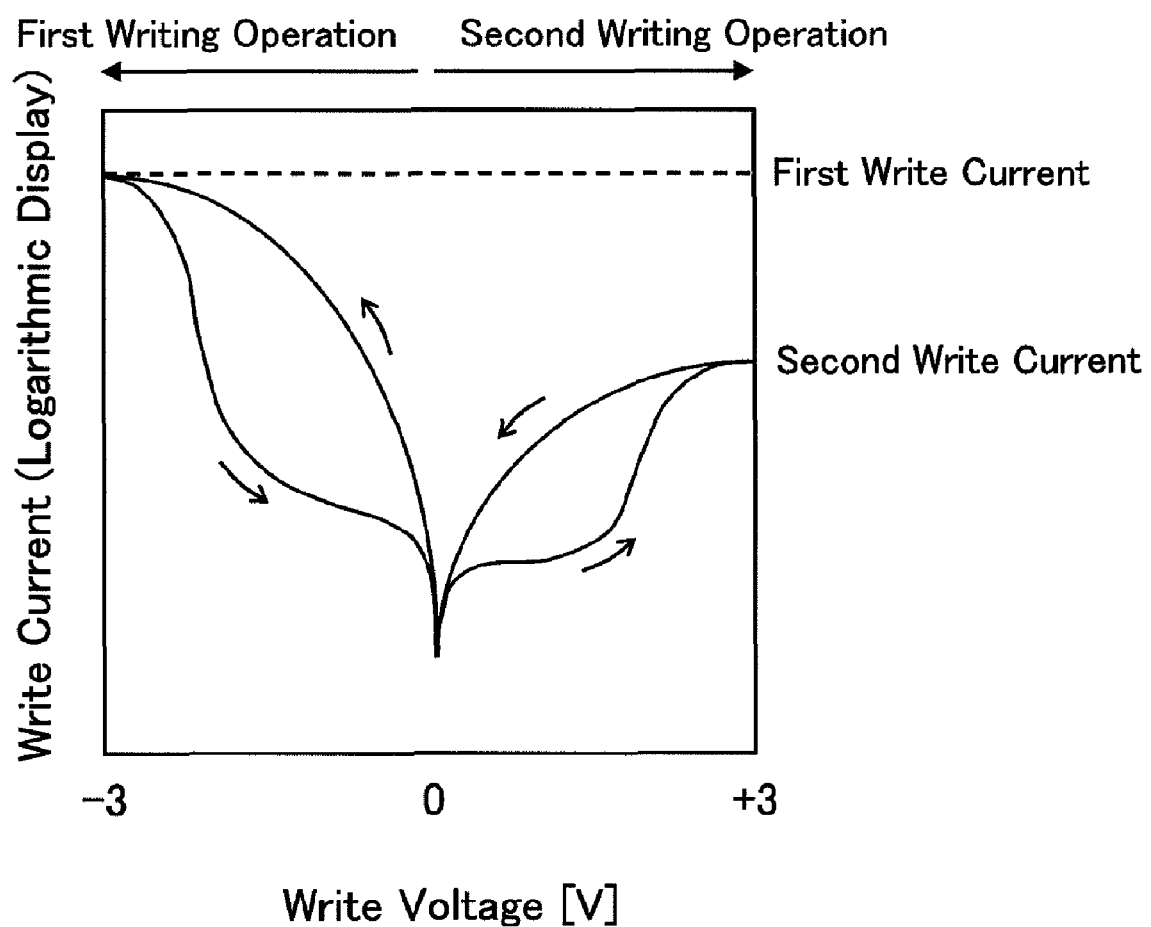
FIG. 2 is a current-voltage characteristic diagram schematically showing one example of asymmetric write current characteristics of a variable resistance element used in a memory cell in one embodiment of the semiconductor memory device according to the present invention.

The variable resistance element 11 is a nonvolatile memory element having a two-terminal structure that can store information in such a way that when a first write voltage is applied to both ends, electric resistance thereof is changed from a first state to a second state and when a second write voltage is applied to both ends, the electric resistance thereof is changed from the second state to the first state. According to the present embodiment, the first write voltage and the second write voltage applied to both ends of the variable resistance element 11 have opposite polarities, and the variable resistance element 11 has write current characteristics that are asymmetric with respect to the polarity of the applied write voltage, in which a first write current applied when the electric resistance is changed from the first state to the second state in response to the application of the first write voltage is larger than a second write current applied when the electric resistance is changed from the second state to the first state in response to the application of the second write voltage. FIG. 2 is a current-voltage characteristic diagram schematically showing one example of the asymmetric write current characteristics of the variable resistance element 11, and it is understood that since the current-voltage characteristics have hysteresis (memory characteristics), the electric resistance is changed from the first state (low resistance state) to the second state (high resistance state) when the first write voltage (negative polar side) is applied, and the electric resistance is changed from the second state (high resistance state) to the first state (low resistance state) when the second write voltage (positive polar side) is applied. Here, the first write current at a time of the first write voltage application is larger than the second write current at a time of the second write voltage application.

In addition, FIG. 2 shows one example to easily understand the asymmetric write current characteristics of the variable resistance element 11 used in the device of the present invention, and shows a typical example in which hysteresis (memory characteristics) is provided with respect to the two write voltages of the positive and negative polarities and the write current is asymmetric with respect to the write voltages of the positive and negative polarities, but the current-voltage characteristics of the variable resistance element 11 is not limited to the characteristics shown in FIG. 2. For example, the polarities of the first write voltage and the second write voltage may be inverted. Furthermore, the definitions of the first state and second state of the electric resistance may be inverted with the above definitions.

Figure 3:
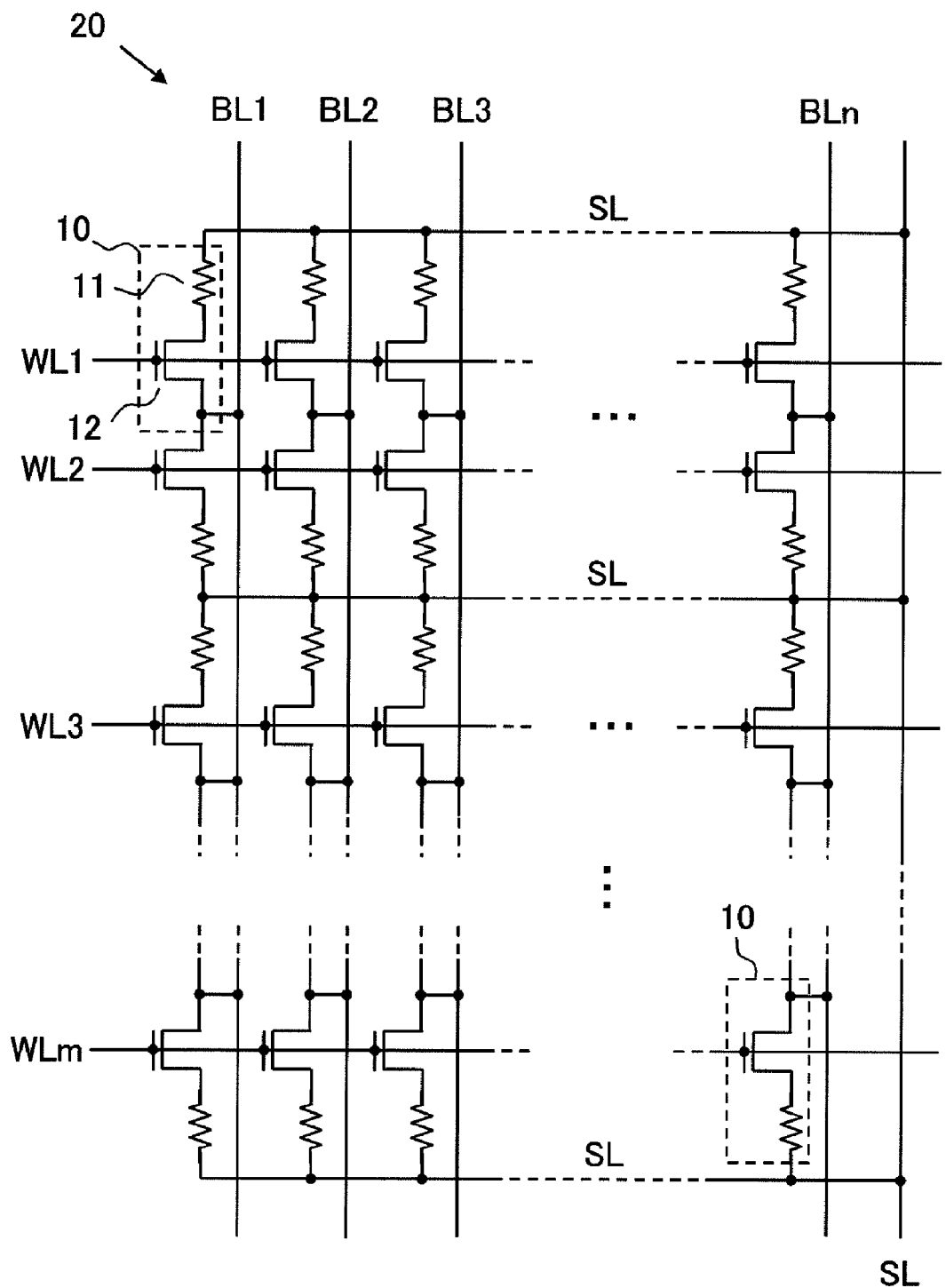
FIG. 3 is a circuit diagram schematically showing another constitution example of a memory cell array in one embodiment of the semiconductor memory device according to the present invention.

In addition, in the circuit constitution shown in FIG. 1, although the other end of the variable resistance element 11 is connected to one of the bit lines BL1 to BLn, and the other of the source and the drain of the selective transistor 12 is connected to the source line SL, as shown in FIG. 3, the other end of the variable resistance element 11 may be connected to the source line SL and the other of the source and the drain of the selective transistor 12 may be connected to the bit lines BL1 to BLn.

Figure 4:
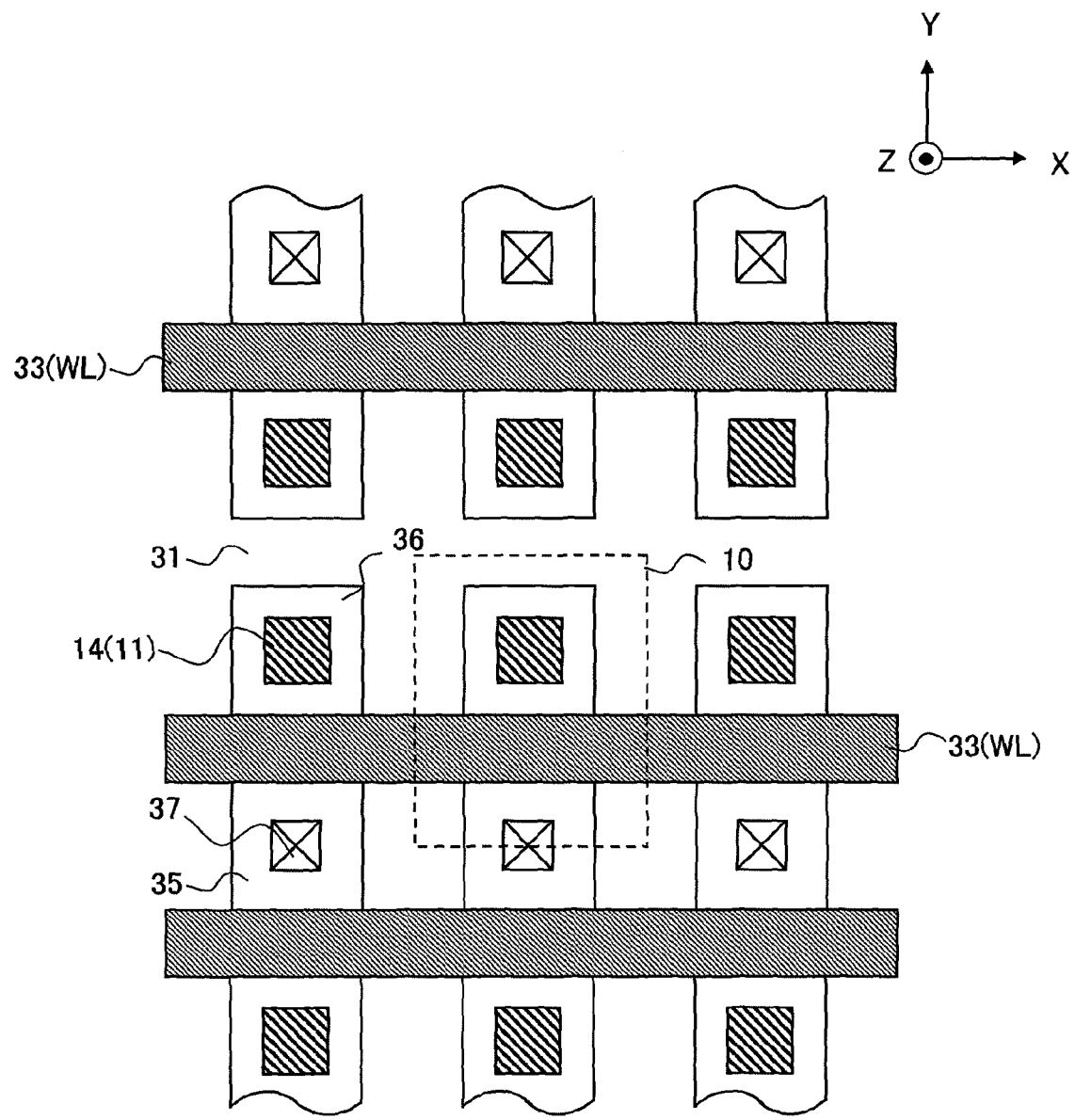
FIG. 4 is a schematic plan view showing a planar constitution of the memory cell and the memory cell array used in one embodiment of the semiconductor memory device according to the present invention.
Figure 5:
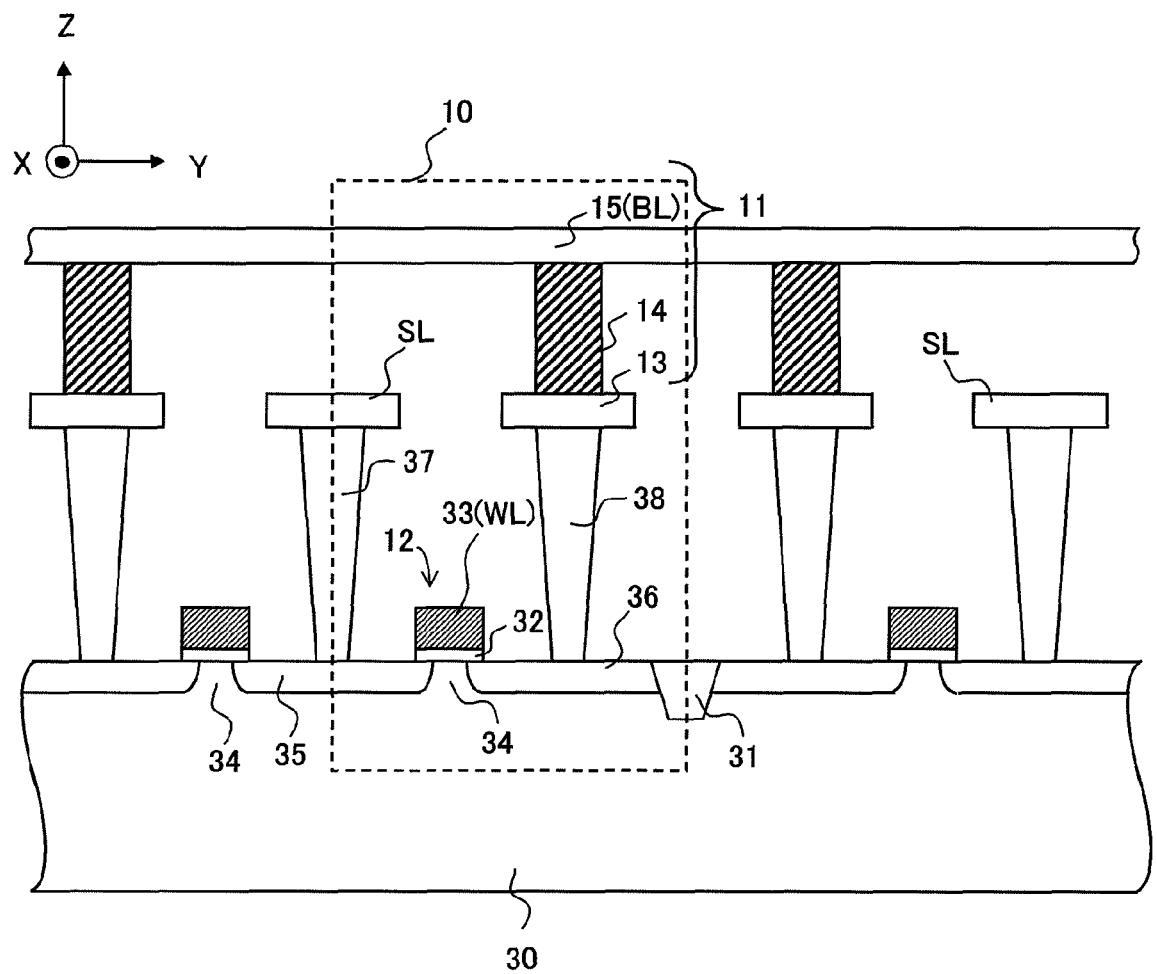
FIG. 5 is a schematic sectional view showing a sectional constitution of the memory cell and the memory cell array used in one embodiment of the semiconductor memory device according to the present invention.

FIGS. 4 and 5 show a schematic planar constitution and sectional constitution of the memory cell 10 and the memory cell array 20 having the circuit constitution shown in FIG. 1. In addition, X, Y and Z directions shown for a descriptive purpose in FIGS. 4 and 5 correspond to the row direction, the column direction, and a direction perpendicular to a semiconductor substrate surface, respectively. FIG. 5 is a sectional view on a Y-Z plane. As shown in FIGS. 4 and 5, at least one part on a P type semiconductor substrate (or a P type well) 40 is an active region surface isolated by an element isolation film 31 such as a STI (Shallow Trench Isolation), a gate insulation film 32 is formed on at least one part of the active region surface, a gate electrode 33 formed of a polycrystalline silicon is arranged so as to cover at least one part of the gate insulation film 32, a channel region 34 is further formed under the gate insulation film 32, impurity diffusion layers 35 and 36 having a polarity (N type) opposite to the semiconductor substrate 30 are formed on both sides of the channel region 34 to form the drain and the source, respectively, whereby the selective transistor 12 is formed. The gate electrode 33 of the selective transistor 12 is connected between the adjacent memory cells in the row direction (X direction), whereby each word line WL (WL1 to WLm) is constituted.

A contact hole 37 filled with a conductive material is formed in an interlayer insulation film above the impurity diffusion layer 35 and connected to the source line SL extending in the row direction (X direction). In addition, a contact hole 38 is similarly formed above the impurity diffusion layer 36, and connected to a lower electrode 13 of the variable resistance element 11. An upper electrode 15 of the variable resistance element 11 extends in the column direction (Y direction) and constitutes each bit line BL (BL1 to BLn). In addition, in the planar view in FIG. 4, the source line SL extending in the row direction (X direction) and each bit line BL (BL1 to BLn) extending in the column direction (Y direction) are omitted to show their lower structure.

The variable resistance element 11 generally has a three-layer structure in which the lower electrode 13, a variable resistor 14 and the upper electrode 15 are laminated in this order. In addition, the variable resistance element 11 is the element in which the electric resistance is changed from the first state to the second state when the first write voltage is applied to both ends thereof, and the electric resistance is changed from the second state to the first state when the second write voltage is applied to both ends thereof as described above, and when it has the asymmetric write current characteristics as shown in FIG. 2, although the element configuration and the material of the variable resistor 14 may be any kind, for example, the variable resistor 14 is formed of an oxide having Perovskite structure containing manganese, material represented by any one of $Pr_{(1-x)}Ca_xMnO_3$, $La_{(1-x)}Ca_xMnO_3$, $La_{(1-x-y)}Ca_xPb_yMnO_3$ (where x<1, y<1, x+y<1), $Sr_2FeMoO_6$, or $Sr_2FeWO_6$, manganese oxide film such as $Pr_{0.7}Ca_{0.3}MnO_3$, $La_{0.65}Ca_{0.35}MnO_3$, $La_{0.65}Ca_{0.175}Pb_{0.175}MnO_3$, or material containing oxide or oxynitride selected from titanium, nickel, vanadium, zirconium, tungsten, cobalt, zinc, iron, and copper. In addition, the variable resistor 14 may be formed such that the oxide having the Perovskite structure containing manganese, the oxide and oxynitride of metal may be sandwiched by metal containing aluminum, copper, titanium, nickel, vanadium, zirconium, tungsten, cobalt, zinc, iron or the like or a conductive oxide film, a nitride film, or an oxynitride film containing the above metal. As described above, as long as the electric resistance is changed from the first state to the second state when the first write voltage is applied to both ends, and the electric resistance is changed from the second state to the first state when the second write voltage is applied to both ends to provide the desired resistance state and to change the resistance state and to provide the asymmetric write current characteristics, the configuration and the material are not limited in particular, but the above material is preferably used to obtain the desired characteristics.

Figure 6:
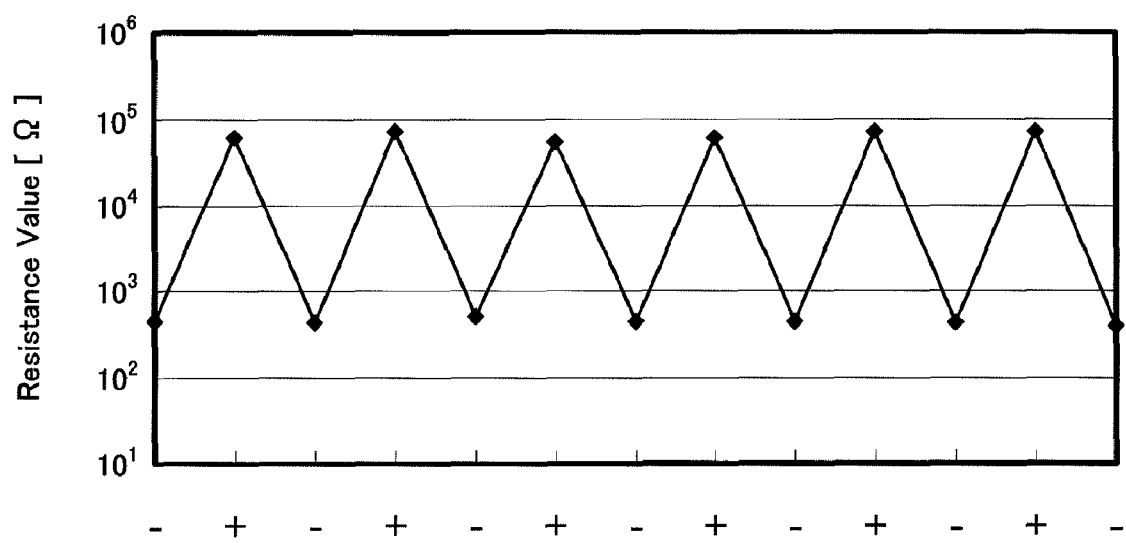
FIG. 6 is a view showing one example of write characteristics of the variable resistance element used in one embodiment of the semiconductor memory device according to the present invention.

In addition, FIG. 6 shows a switching behavior (write characteristics) of the electric resistance when the voltage is applied to the variable resistor 14 formed of an oxynitride containing titanium as one example of the variable resistance element 11. According to the example shown in FIG. 6, when a positive voltage is applied to the other electrode based on one electrode (displayed as + sign in the figure), the electric resistance of the variable resistance element 11 is changed from the low resistance to the high resistance state. Meanwhile, when a negative voltage is applied to the other electrode based on the one electrode (displayed as − sign in the figure), the electric resistance of the variable resistance element 11 is changed from the high resistance state to the low resistance state. Thus, when the polarity of the write voltage applied to both ends of the variable resistance element 11 is alternately changed, the electric resistance of the variable resistance element 11 is switched alternately between the low resistance state and the high resistance state, and binary data ("0"/"1") is stored in the variable resistance element 11 and written based on the change of the resistance state.

Next, a writing operation according to the device of the present invention will be described. First, a description will be made of the basics of an application condition of the write voltage to the variable resistance element in the memory cell.

In a first writing operation in which the resistance state of the variable resistance element is changed from the first state (low resistance state) to the second state (high resistance state), the positive first write voltage (+3 V, for example) is applied to the upper electrode as the other end of the variable resistance element, based on the lower electrode (0 V) as the one end of the variable resistance element. In other words, it is equivalent to a case where the negative first write voltage (−3 V, for example) is applied to the lower electrode as the one end of the variable resistance element, based on the upper electrode (0 V) as the other end of the variable resistance element, which corresponds to characteristics on the negative polarity side of the current-voltage characteristics shown in FIG. 2. At this time, the first write current applied from the upper electrode to the lower electrode of the variable resistance element is about 100 μA. In addition, in a second writing operation in which the resistance state of the variable resistance element is changed from the second state (high resistance state) to the first state (low resistance state), the second write voltage (+2.5 V, for example) is applied to the lower electrode as the one end of the variable resistance element, based on the upper electrode (0 V) as the other end of the variable resistance element, which corresponds to characteristics on the positive polarity side of the current-voltage characteristics shown in FIG. 2. At this time, the second write current applied from the lower electrode to the upper electrode of the variable resistance element is about 1 μA, for example, which is only about 1/100 of the first write current.

More specifically, similar to the asymmetric write current characteristics shown in the current-voltage characteristics shown in FIG. 2, the variable resistance element in the above specific example shows asymmetric property in which the write current (first write current and the second write current) applied when the resistance value is changed from one resistance state to the other resistance state varies depending on the polarity of the write voltage applied to both ends of the variable resistance element.

Next, a description will be made of a case where an "erasing operation" is performed for the plurality of memory cells collectively at the same time, and a "programming operation" is performed for a certain memory cell individually. According to the present embodiment, it is assumed that the second writing operation is executed as the "erasing operation", and the first writing operation is executed as the "programming operation. When the memory cell is in an erased state, the electric resistance of the variable resistance element is in the first state (low resistance state), and when the memory cell is in a programmed state, the electric resistance of the variable resistance element is in the second state (high resistance state). According to the present embodiment, since the "erasing operation" as the writing operation having the smaller write current is performed for the plurality of memory cells collectively at the same time, a total write current at a time of collective erasing operation can be prevented from increasing too much with respect to the write current at a time of programming operation. In addition, since the "erasing operation" is performed for all of the plurality of memory cells to be written collectively at the same time, a write time required for the erasing operation can be considerably shortened, and a time required for the entire writing operation can be shortened.

When it is assumed that the "programming operation" is performed for the plurality of memory cells collectively at the same time instead of the "erasing operation", although a write time required for the programming operation can be shortened and the time required for the entire writing operation can be shortened similarly to the above, a total write current at the time of collective programming operation is extremely increased, that is, becomes about 100 times as large as compared to that at the time of collective erasing operation, so that it exceeds a supply capability of the write current in the semiconductor device, and the output voltage (first write voltage) is lowered due to an internal resistance of a power supply circuit to supply the first write voltage, and the programming operation may become insufficient or cannot be performed. Here, considering the supply capability of the write current of the power supply circuit, as for the write current for each memory cell, the first write current of the first writing operation is larger than the second write current of the second writing operation, even when the first writing operation is performed by each memory cell, the supply capability of the write current of the power supply circuit has to be at least larger than the first write current having a sufficient margin. Therefore, when the total write current at the time of collective erasing operation (current value provided by multiplying a second memory cell number defined by a maximum number of the memory cells to be subjected to the second writing operation by the second write current) is set to be not less than the first write current and within the supply capability of the write current of the power supply circuit, the writing time required for the erasing operation can be minimized. That is, the second memory cell number is to be not less than a write current ratio provided by dividing the second write current by the first write current.

The asymmetric property of the write current with respect to the polarity of the write voltage applied to both ends of the variable resistance element is not determined uniquely with respect to the directions of the upper electrode and the lower electrode, but varied depending on a production process and an element structure. Therefore, according to a method for executing the erasing operation collectively for the plurality of memory cells to be written by setting the either one of the resistance states of the first state or the second state (low resistance state or high resistance state) of the electric resistance of the variable resistance element to be in the erased state fixedly, the first or the second writing operation corresponding to the erasing operation is not always the writing operation having the smaller write current, depending on a selection of an architecture regarding the constitutions of the variable resistance element and the selective transistor, and the voltage constitution and the like applied to the bit line and the source line, and as a result, the total write current could be extremely increased, which is not preferable. According to the device of the present invention, since the second writing operation having the smaller write current is selected as the erasing operation, and the erasing operation is performed for the plurality of memory cells to be written collectively, the total write current does not exceed the supply capability of the write current in the semiconductor device, so that the semiconductor memory device that can reduce the time required for the entire writing operation can be realized.

Next, a description will be made of a voltage application condition to each of the word lines WL1 to WLm, each of the bit lines BL1 to BLn, and the source line SL in the memory cell array 20 shown in FIG. 1, in each writing operation of the method of the present invention in which the "erasing operation" is performed for the plurality of memory cells collectively at the same time and the "programming operation" is performed for the memory cell individually, along a series of write control procedures.

Figure 7:
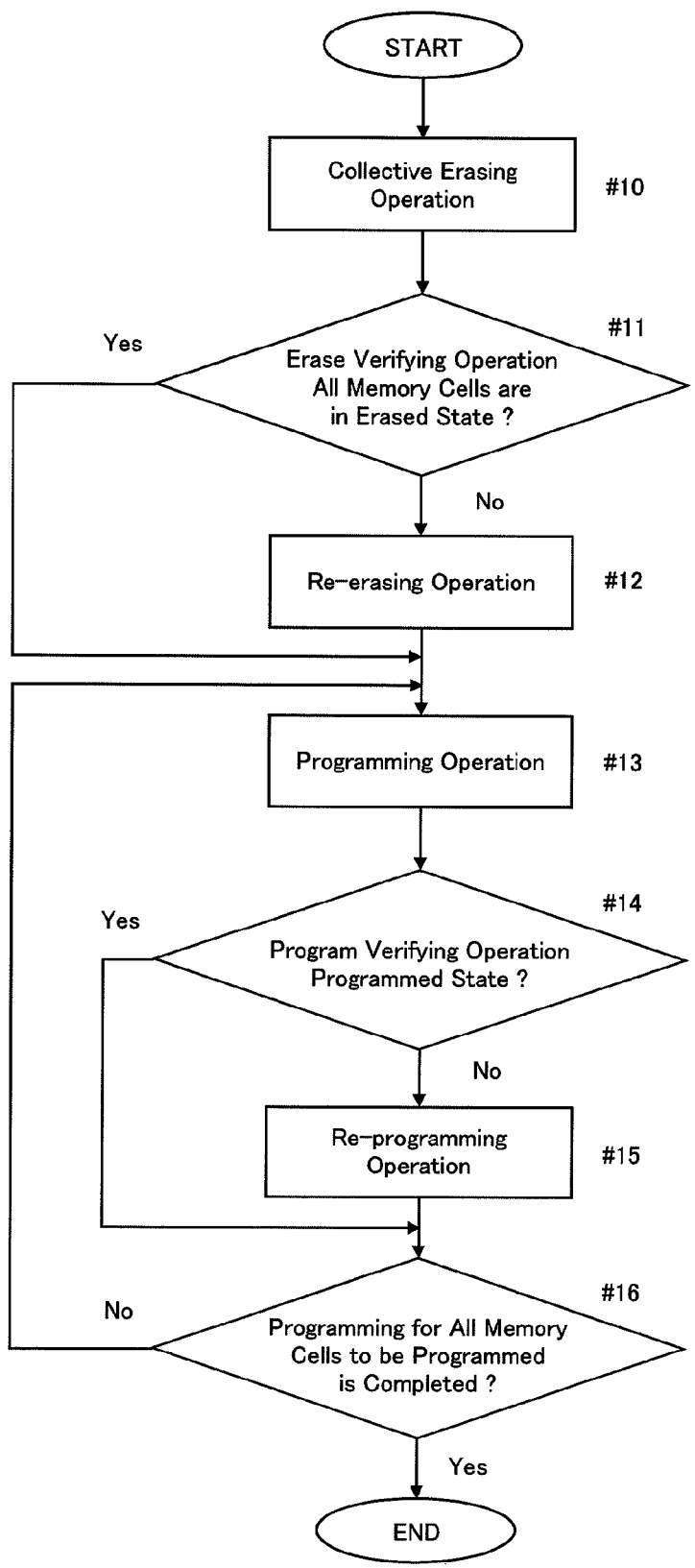
FIG. 7 is a flowchart showing process procedures of a writing operation of data in a first embodiment of a writing method of the semiconductor memory device according to the present invention.

According to the series of write control procedures described below, as shown in FIG. 7, the collective erasing operation (#10), an erase verifying operation (#11), a re-erasing operation (#12), the programming operation (#13), a program verifying operation (#14), and a re-programming operation (#15) are sequentially executed. Here, the erase verifying operation is a kind of reading operation to verify whether the last erasing operation has been normally performed or not by reading stored data (resistance state). The re-erasing operation is the individual erasing operation for the unerased memory cell or the collective erasing operation for the plurality of memory cells containing the unerased memory cells based on the result of the erase verifying operation in a case where the unerased memory cell exists. The program verifying operation is a kind of reading operation to verify whether the last programming operation has been normally performed or not by reading stored data (resistance state). The re-programming operation is the programming operation for the unwritten memory cell based on the result of the program verifying operation in a case where the unwritten memory cell exists.

Figure 8:
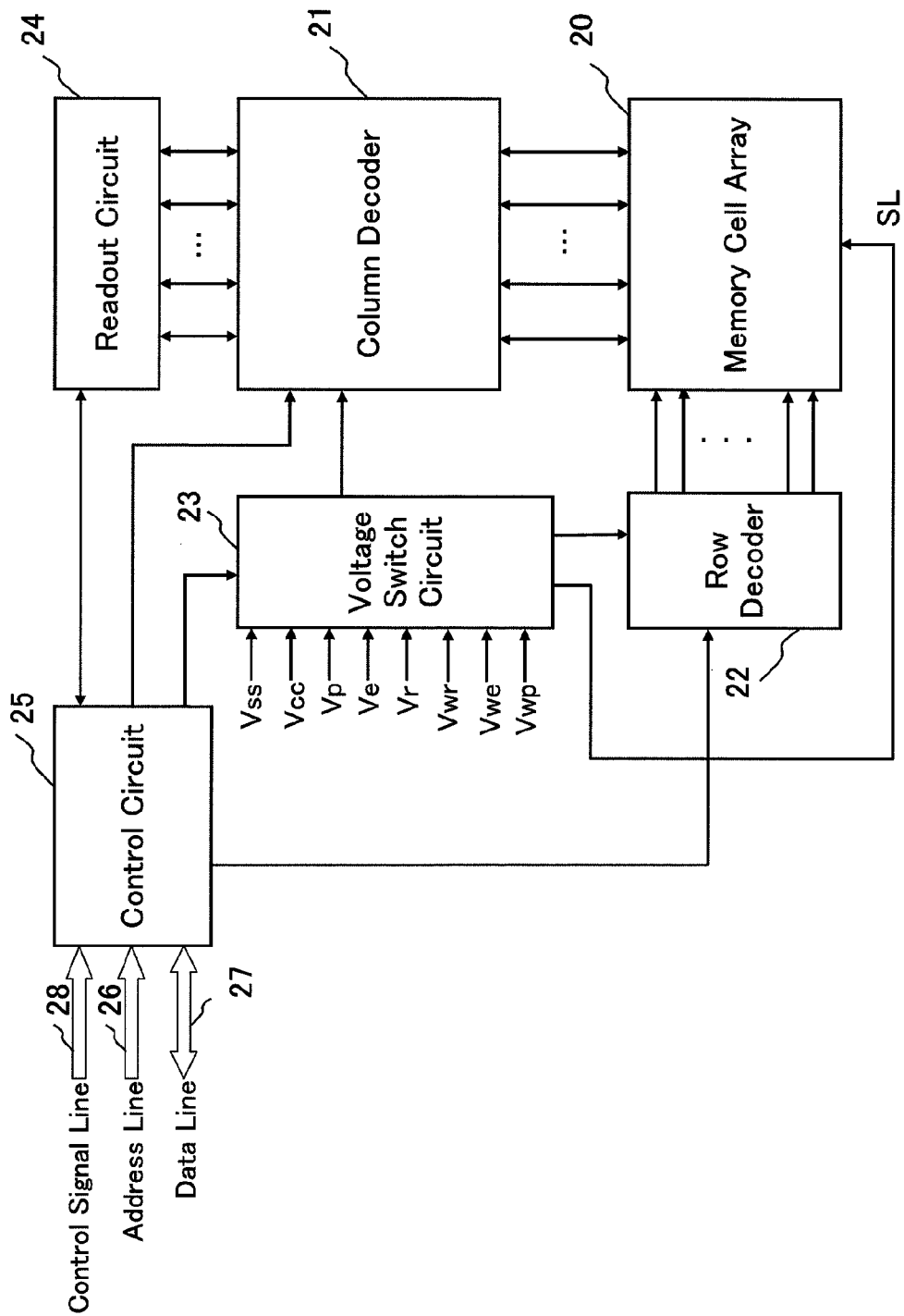
FIG. 8 is a block diagram showing a schematic constitution in one embodiment of the semiconductor memory device according to the present invention.

First, a description will be made of a peripheral circuit constitution to apply predetermined voltages to be described later to the word lines WL1 to WLm, the bit lines BL1 to BLn, and the source line SL. FIG. 8 is a view schematically showing the peripheral circuit constitution of the device of the present invention.

As shown in FIG. 8, the device of the present invention is provided with a column decoder 21, a row decoder 22, a voltage switch circuit 23, a readout circuit 24, and a control circuit 25 in the periphery of the memory cell array 20 shown in FIG. 1.

The column decoder 21 and the row decoder 22 select the memory cell to become the target of the reading operation (including the erase verifying operation and the program verifying operation), the programming operation (first writing operation), or erasing operation (second writing operation) from the memory cell array 20 corresponding to an address inputted from an address line 26 to the control circuit 25. In the normal reading operation except for the verifying operation, the row decoder 22 selects the word line of the memory cell array 20 corresponding to a signal inputted to the address line 26, and the column decoder 21 selects the bit line of the memory cell array 20 corresponding to an address signal inputted to the address line 26. In addition, in the programming operation, the erasing operation and the verifying operation associated with these operations, the row decoder 22 selects one or more word lines of the memory cell array 20 corresponding to a row address designated by the control circuit 25, and the column decoder 21 selects one or more bit lines of the memory cell array 20 corresponding to a column address designated by the control circuit 25. The memory cell connected to the selected word line selected by the row decoder 22 and the selected bit line selected by the column decoder 21 is selected as the selected memory cell.

The control circuit 25 controls each of the programming operation, the erasing operation (including the collective erasing operation), and the reading operation of the memory cell array 20. Particularly, in the writing operation for the plurality of memory cells, the control circuit 25 controls the above series of write control procedures. The control circuit 25 controls each of the row decoder 22, the column decoder 21, the voltage switch circuit 23, the reading, writing and erasing of the memory cell array 20, based on the address signal inputted from the address line 26, a data input inputted from data line 27 (at the time of programming), and a control input signal inputted from the control signal line 28. According to the example shown in FIG. 8, although not shown in the figure, the control circuit 25 has functions as a general address buffer circuit, a data input/output buffer circuit, and a control input buffer circuit.

The voltage switch circuit 23 switches voltages applied to the word lines (selected word line and unselected word line), the bit lines (selected bit line and the unselected bit line), and the source line to be required for each of the reading, programming and erasing operations of the memory cell array 20 based on an operation mode, whereby they are supplied to the memory cell array 20. Therefore, the voltages to be applied to the selected word line and the unselected word lines are supplied from the voltage switch circuit 23 through the row decoder 22, and the voltages to be applied to the selected bit line and the unselected bit lines are supplied from the voltage switch circuit 23 through the column decoder 21, and the voltage to be applied to the source line is directly supplied from the voltage switch circuit 23 to the source line. In addition, in FIG. 8, Vcc denotes a power supply voltage of the device of the present invention, Vss denotes a ground voltage, Vr denotes a readout voltage, Vp denotes a supply voltage for the programming operation (an absolute value of the first write voltage), Ve denotes a supply voltage for the erasing operation (absolute value of the second write voltage), Vwr denotes a selected word line voltage for the reading operation, Vwp denotes a selected word line voltage for the programming operation, and Vwe denotes a selected word line voltage for the erasing operation. In addition, when the supply voltage for the programming operation (write voltage) Vp and the supply voltage for the erasing operation (erase voltage) Ve are the same voltage, both can be commonly used and when the selected word line voltage Vwp for the programming operation and the selected word line voltage Vwe for the erasing operation are the same voltage, both can be commonly used.

The readout circuit 24 determines the state of the stored data (resistance state) by comparing a readout current applied from the selected bit line selected by the column decoder 21 to the source line through the selected memory cell, for example, with a reference current or a reference voltage, directly or after converted to the voltage, and transfers the result to the control circuit 25 so that the result is outputted to the data line 27.

Figure 9:
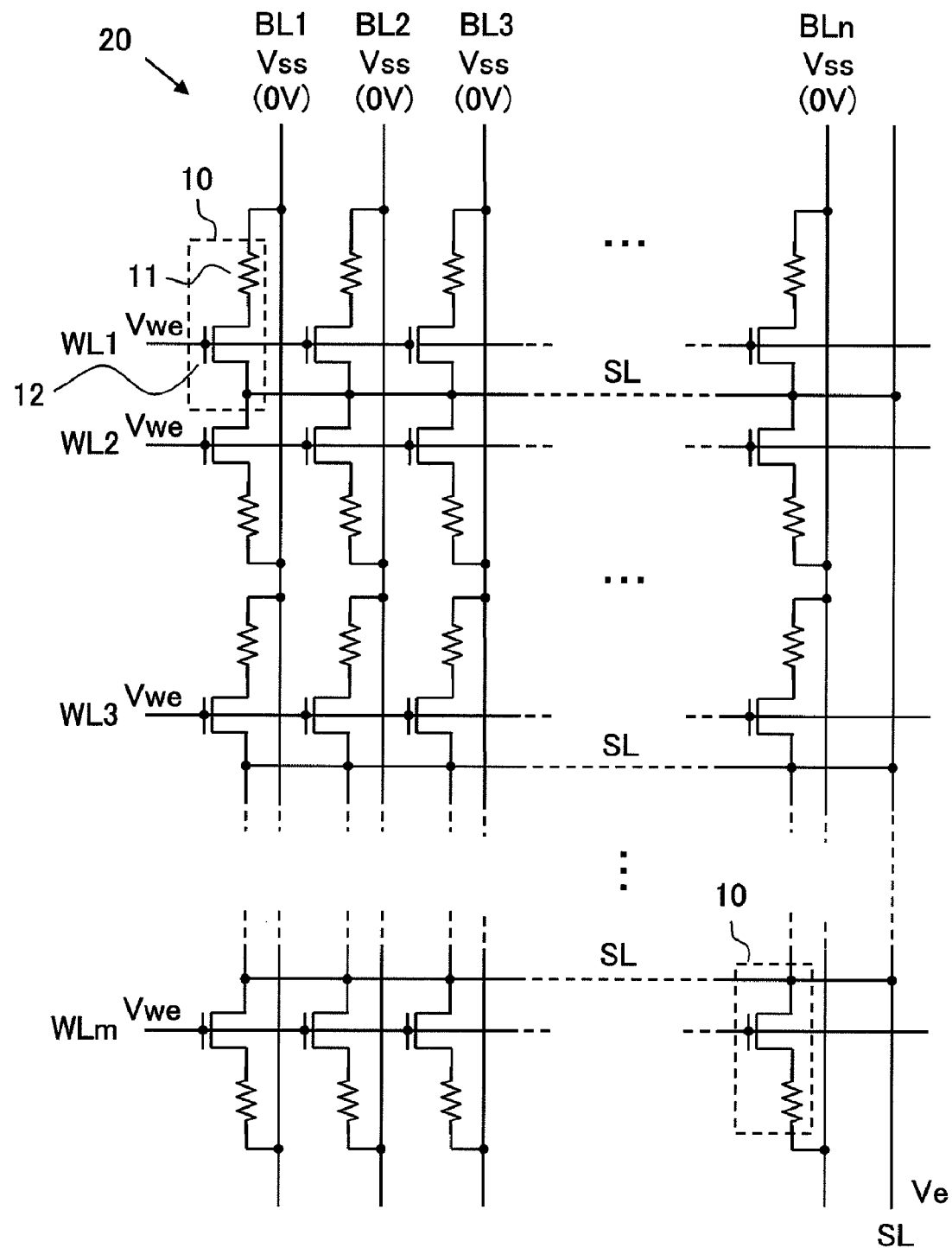
FIG. 9 is a view showing a voltage application condition at a time of a collective erasing operation (second writing operation) in one embodiment of the semiconductor memory device according to the present invention.

Next, a description will be made of a voltage application condition in the case where the erasing operation is performed for the memory cell array 20 as a unit for the collective erasing operation, shown in step #10 in FIG. 7. When the memory cell array 20 is collectively erased, as shown in FIG. 9, the row decoder 22 selects all the word lines WL1 to WLm as the selected word lines, and the predetermined selected word line voltage Vwe (3 V, for example) is applied. In addition, the column decoder 21 selects all the bit lines BL1 to BLn as the selected bit lines, and 0 V (ground voltage Vss) is applied thereto. The erase voltage Ve (3 V, for example) is applied to the source line SL. Thus, since all the selective transistors of the memory cells are turned on and the erase voltage Ve applied to the source line SL is applied to the lower electrode of the variable resistance element through the selective transistor up to a ceiling of a voltage value (Vwe−Vth) provided by subtracting a threshold voltage (Vth) of the selective transistor from the gate voltage (Vwe) of the selective transistor, and at the same time, the voltage 0 V (ground voltage Vss) is applied to the upper electrode of the variable resistance element through the bit line BL1, so that the positive voltage (Vwe−Vth) is applied to the lower electrode based on the upper electrode between both ends of the variable resistance element of each memory cell. Thus, when it is assumed that the effective threshold voltage (Vth) is 0.5 V, +2.5 V (corresponding to the second write voltage) is applied to both ends of the variable resistance element based on the upper electrode, so that the second writing operation corresponding to the characteristics on the positive polar side of the current-voltage characteristics shown in FIG. 2 is executed. As a result, the resistance state of the variable resistance element of each memory cell is changed from the second state (higher resistance state) to the first state (low resistance state) and the collective erasing operation is performed.

Here, when the selected word line voltage Vwe is set higher than a sum of the erase voltage Ve and the threshold voltage (Vth), the erase voltage Ve can be applied to both ends of the variable resistance element. Therefore, in the case where the selected word line voltage Vwe is lower than the sum of the erase voltage Ve and the threshold voltage (Vth), since the effective erase voltage (second write voltage) applied to both ends of the variable resistance element of each memory cell is lowered, when it is necessary to prevent the second write voltage from being lowered, it is necessary to raise the selected word line voltage Vwe or lower the threshold voltage (Vth). Therefore, in order to keep the selected word line voltage Vwe at the low voltage and to prevent the voltage from lowering by the threshold voltage in the on state, it is preferable to set the threshold voltage (Vth) of the selective transistor as low as possible within a range capable of sufficiently preventing an off-leak current in the off state (gate voltage is 0 V). According to the present embodiment, the threshold voltage of about 0.5 V is assumed as one example.

In addition, when a part of the memory cells in the memory cell array 20 is to be erased collectively, for example, when the plurality of memory cells are collectively erased by the one or more rows, one or more word lines corresponding to the rows to be collectively erased are selected, the selected word line voltage Vwe is applied only to the selected word lines, and 0 V (ground voltage Vss) is applied to the other unselected word lines, so that only the selective transistors of the selected memory cells connected to the selected word line are turned on and the positive voltage (Vwe−Vth) is applied to the lower electrode based on the upper electrode between both ends of the variable resistance element, and one part of the memory cells in the memory cell array 20 can be collectively erased by the one or more rows. In addition, when the plurality of word lines are selected optionally, a function to select the plurality of word lines optionally is to be added to the row decoder 22.

Furthermore, when a part of the memory cells in the memory cell array 20 is to be erased collectively, for example, when the plurality of memory cells are collectively erased by the one or more columns, one or more bit lines corresponding to the columns to be collectively erased are selected, 0 V (ground voltage Vss) is applied only to the selected bit lines, and the erase voltage Ve is applied to the other unselected bit lines or the other unselected bit lines are made to be in a floating state (high impedance state), so that the positive voltage (Vwe−Vth) is applied to the lower electrode based on the upper electrode only between both ends of the variable resistance elements of the selected memory cells connected to the selected bit line, and one part of the memory cells in the memory cell array 20 can be collectively erased by the one or more columns. In addition, when the plurality of bit lines are selected optionally, a function to select the plurality of bit lines optionally is to be added to the column decoder 21.

Furthermore, when a part of the memory cells in the memory cell array 20 is to be erased collectively, for example, when the plurality of memory cells defined by one or more rows and columns, as described above, one or more word lines corresponding to the rows to be collectively erased are selected, the selected word line voltage Vwe is applied only to the selected word lines, and 0 V (ground voltage Vss) is applied to the other unselected word lines, one or more bit lines corresponding to the columns to be collectively erased are selected, 0 V (ground voltage Vss) is applied only to the selected bit lines, and the erase voltage Ve is applied to the other unselected bit lines or the other unselected bit lines are made to be in the floating state, so that the positive voltage (Vwe−Vth) is applied to the lower electrode based on the upper electrode only between both ends of the variable resistance element of the selected memory cell to be erased collectively, and one part of the memory cells in the memory cell array 20 are defined by one part of the rows and columns and can be collectively erased.

Then, when the collective erasing operation shown in step #10 in FIG. 7 is completed, the erase verifying operation in step #11 is executed. The erase verifying operation is the reading operation to verify whether or not the resistance state of the variable resistance elements of the plurality of memory cells subjected to the collective erasing operation is in the first state correctly. Therefore, the operation is not just the reading operation, but determines whether or not all the memory cells subjected to the collective erasing operation are in the erased state by comparing the read data with an expectation value (resistance state is in the first state). The voltage application condition in the case of the reading operation will be described below.

Here, when all of the memory cells are in the erased state (YES in step #11), the process is moved to the programming operation in step #13. However, when not all of the memory cells are in the erased state (NO in step #11), the process is moved to the re-erasing operation in step #12.

In the re-erasing operation in step #12, the same collective erasing operation as in step #10 is executed for all the memory cells to be written. In this case, instead of the collective erasing operation in which the memory cell array 20 is the unit of the collective erasing operation, the row-based or column-based collective erasing operation including the unerased memory cell determined to be in the unerased state in the erase verifying operation in step #11 may be performed. A voltage application condition in the collective erasing operation for one part of the memory cells is the same as that described in step #10 and the description thereof is not given.

In the case where the re-erasing operation is performed by one or more rows, the erase verifying operation in step #11 is performed by the row, and only when the unerased memory cell is included in the row, the re-erasing operation is performed in the corresponding row, so that the erase verifying operation in step #11 and the re-erasing operation in step #12 are performed for all the rows in the memory cell array 20 while the target row is sequentially changed. Similarly, in the case where the re-erasing operation is performed by the one or more columns, the erase verifying operation in step #11 is performed by the column, and only when the unerased memory cell is included in the column, the re-erasing operation is performed in the corresponding column, so that the erase verifying operation in step #11 and the re-erasing operation in step #12 are performed for all the columns in the memory cell array 20 while the target column is sequentially changed.

In addition, the re-erasing operation in step #12 may be performed for the memory cell determined to be in the unerased state by the memory cell. In this case, the erase verifying operation in step #11 is performed by the memory cell, and only when the memory cell is determined to be in the unerased state, the re-erasing operation is performed for the memory cell. The erase verifying operation in step #11 and the re-erasing operation in step #12 are performed for all the memory cells subjected to the collective erasing operation in the memory cell array 20 while the target memory cell is sequentially changed.

Figure 10:
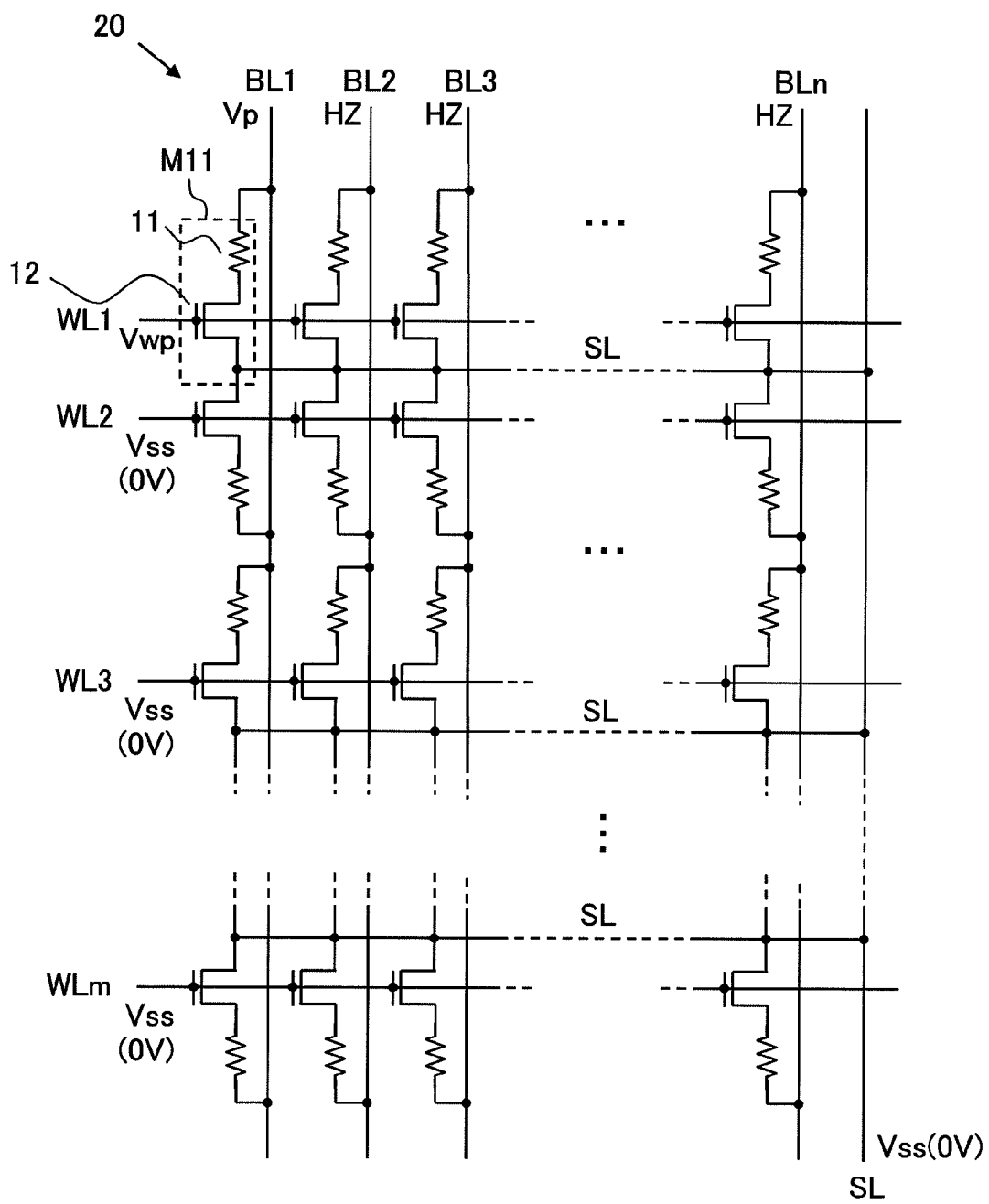
FIG. 10 is a view showing a voltage application condition at a time of a programming operation (first writing operation) in one embodiment of the semiconductor memory device according to the present invention.

Next, a description will be made of a voltage application condition when the programming operation (first writing operation) is performed individually for the memory cell in the memory cell array 20 shown in step #13 in FIG. 7. When a single memory cell is the unit of the programming operation, for example, when a memory cell M11 connected to the word line WL1 and the bit line BL1 is the target of the individual programming operation as shown in FIG. 10, the word line WL1 is selected by the row decoder 22 as the selected word line, the predetermined selected word line voltage Vwp (3 V, for example) is applied thereto, and 0 V (ground voltage Vss) is applied to other unselected word lines WL2 to WLm. In addition, the bit line BL1 is selected by the column decoder 21 as the selected bit line, and the program voltage Vp (3 V, for example) is applied thereto, and the other unselected bit lines BL2 to BLn are made to be in the floating state (high impedance state). In addition, 0 V (ground voltage Vss) is applied to the source line SL. Thus, the selective transistor of the selected memory cell M11 is turned on and 0 V (ground voltage Vss) applied to the source line SL is applied to the lower electrode of the variable resistance element through the selective transistor that is in on state, and at the same time, the program voltage Vp (3 V, for example) is applied to the upper electrode of the variable resistance element through the bit line BL1, so that the negative voltage (−Vwp=−3 V corresponding to the negative first write voltage) is applied to the lower electrode based on the upper electrode only between both ends of the variable resistance element of the selected memory cell M11, and the first write operation corresponding to the characteristics of the negative polar side of the current-voltage characteristics shown in FIG. 2 is executed. As a result, the resistance state of the variable resistance element of the selected memory cell M11 is changed from the first state (low resistance state) to the second state (high resistance state) and the programming operation is performed.

Here, regarding a voltage application condition when the programming operation (first writing operation) is performed for the plurality of memory cells in the memory cell array 20 at the same time, the memory cells to be programmed are to be arranged in the same row or the same column. For example, when the programming operation is performed for the plurality of memory cells in the same row at the same time, similarly to the individual programming operation, the predetermined selected word line voltage Vwp (3 V, for example) is applied to the selected word line selected by the row decoder 22, and 0 V (ground voltage Vss) is applied to the other unselected word lines. In addition, each bit line connected to the plurality of memory cells to be programmed is selected by the column decoder 21 as the selected bit line, and the program voltage Vp (3 V, for example) is applied thereto and the other unselected bit lines are made to be in the floating state (high impedance state). In addition, 0 V (ground voltage Vss) is applied to the source line SL. Thus, the negative voltage (−Vwp=−3 V corresponding to the negative first write voltage) is applied to the lower electrode based on the upper electrode only in the plurality of selected memory cells to be programmed, and the first write operation corresponding to the characteristics of the negative polar side of the current-voltage characteristics shown in FIG. 2 is executed. As a result, the resistance state of the variable resistance elements of the plurality of selected memory cells to be programmed is changed from the first state (low resistance state) to the second state (high resistance state) and the programming operation is performed.

When the programming operation (first writing operation) is performed for the plurality of memory cells at the same time, since the writing operation having the larger write current is performed at the same time, the supply capability of the write current in the programming operation is to be concerned. Therefore, the current supply capability of the power supply circuit to supply the first write voltage to the memory cell array has to be previously designed to be not less than a current value provided by multiplying the first memory cell number defined by the maximum value of the memory cell number to be programmed at the same time by the first write current. Here, as for the relation between the second memory cell number defined by the maximum memory cell number at the time of the collective erasing operation and the first memory cell number, in the case where the supply of the write current at the time of programming operation and the supply of the write current at the time of the collective erasing operation are commonly performed from one power supply circuit, the memory cell number ratio between the second memory cell number and the first memory cell number is defined such that the current value provided by multiplying the first memory cell number by the first write current (total write current at the time of programming operation) and the current value provided by multiplying the second memory cell number by the second write current (total write current at the time of collective erasing operation) become almost equal to each other, so that the power supply circuit is not unnecessarily enlarged for one writing operation, and a chip size is prevented from being increased and the production cost can be reduced.

Next, when the programming operation in step #13 shown in FIG. 7 is completed, the program verifying operation in step #14 is executed. The program verifying operation executes the reading operation to verify whether or not the resistance state of the variable resistance element of the selected memory cell subjected to the programming operation is in the second state correctly. Therefore, it is not just the reading operation, but determines whether or not the selected memory cell subjected to the programming operation is in the programmed state by comparing the read data with an expectation value (resistance state is in the second state). The voltage application condition in the case of the reading operation will be described below.

Here, when the selected memory cell is in the programmed state (YES in step #14), the process proceeds to step #16 and it is determined whether or not the programming operation of all the memory cells to be programmed is completed and when the programming operation for all of the memory cells to be programmed is completed (YES at the branch), the series of writing operation is completed. When the programming operation for all the memory cells to be programmed is not completed (NO at the branch), the selected memory cell to be programmed is changed and the programming operation in step #13 is repeated. However, when the selected memory cell is not in the programmed state in step #14 (NO in step #14), the process proceeds to the re-programming operation in step #15. In the re-programming operation in step #15, the same programming operation as in step #13 is performed again with respect to the same selected memory cell.

Figure 11:
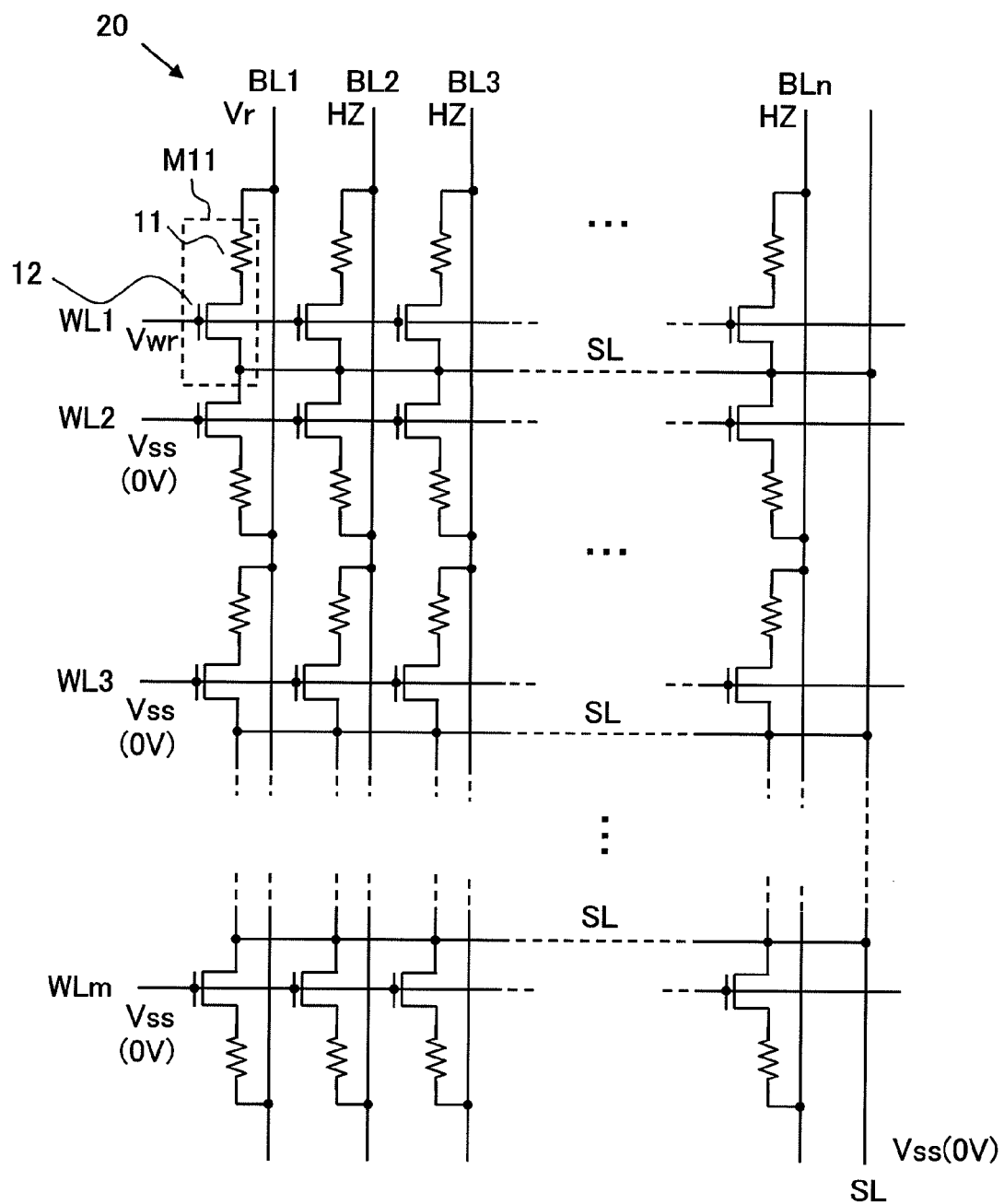
FIG. 11 is a view showing a voltage application condition at a time of a reading operation in one embodiment of the semiconductor memory device according to the present invention.

Next, a description will be made of a voltage application condition when the reading operation is performed for the memory cell in the memory cell array 20 individually. When the single memory cell is the unit of the reading operation, for example, when the memory cell M11 connected to the word line WL1 and the bit line BL1 is to be read as shown in FIG. 11, the word line WL1 is selected by the row decoder 22 as the selected word line, the selected word line voltage Vwr (1 V, for example) is applied thereto and 0 V (ground voltage Vss) is applied to the other unselected word lines WL2 to WLm. In addition, the bit line BL1 is selected by the column decoder 21 as the selected bit line, the readout voltage Vr (0.5 V, for example) is applied thereto, and the other unselected bit lines BL2 to BLn are made to be in the floating state (high impedance state). In addition, 0 V (ground voltage Vss) is applied to the source line SL. Thus, the selective transistor of the selected memory cell M11 is turned on and 0 V (ground voltage Vss) applied to the source line SL is applied to the lower electrode of the variable resistance element through the selective transistor and at the same time, the readout voltage Vr (0.5 V, for example) is applied to the upper electrode of the variable resistance element through the bit line BL1, so that the negative voltage (−Vr=−0.5 V) is applied to the lower electrode based on the upper electrode only between both ends of the variable resistance element of the selected memory cell M11, and the readout current corresponding to the resistance state of the variable resistance element is applied from the upper electrode to the lower electrode in the variable resistance element of the selected memory cell M11. Therefore, since the readout current is applied from the selected bit line BL1 to the source line SL, when the readout current is detected by the readout circuit 24 through the column decoder 21, the stored data of the selected memory cell M11 can be read. In addition, the voltage application condition of this reading operation can be applied to the verifying operations associated with the erasing operation and the programming operation similarly.

Here, it is to be noted that since the polarity of the readout voltage applied to both ends of the variable resistance element at the time of reading operation, and the polarity of the first write voltage applied to both ends of the variable resistance element at the time of programming operation that is the writing operation having larger write current are the same, although the voltage values applied to both ends of the variable resistance element are different, a large readout current difference based on the difference in resistance state can be provided as compared with the case where the voltages having opposite polarities are applied, so that a margin of the reading operation can be increased.

Second Embodiment

Next, a device of the present invention and a method of the present invention according to a second embodiment will be described. More specifically, a description will be made of a case where in the write control procedures according to the method of the present invention, a preprocess operation to set the resistance states of the memory cells to be collectively erased uniformly to the second state is added before the execution of the collective erasing operation in step #10 shown in FIG. 7 of the control procedures in the first embodiment. It is to be noted that the device of the present invention according to the second embodiment is the same as that in the first embodiment except that the preprocess operation is added to the series of write control procedures by the control circuit 25, and the overlapping description is not given.

According to the data writing operation in the first embodiment, after all the memory cells to be written are collectively erased, or after the part of the plurality of memory cells to be written are collectively erased sequentially and repeatedly, the programming operation is performed on only the memory cell to be programmed. However, the stored states (resistance state of the variable resistance element) before the collective erasing operation of the plurality of memory cells to be written are not always uniform. Therefore, variations are generated in the erased state (the electric resistance is in the first state) of the variable resistance elements when the voltage is applied to the variable resistance elements having the different initial resistance states under the same condition of the erasing operation, depending on the erasing characteristics of the variable resistance elements of the memory cells, and when the programming operation is performed in the erased states having the variations, the variations could be cumulatively generated in the programmed states (electric resistance is in the second state) after the programming operation, which could affect the normal reading operation after the series of writing operation.

Figure 12:
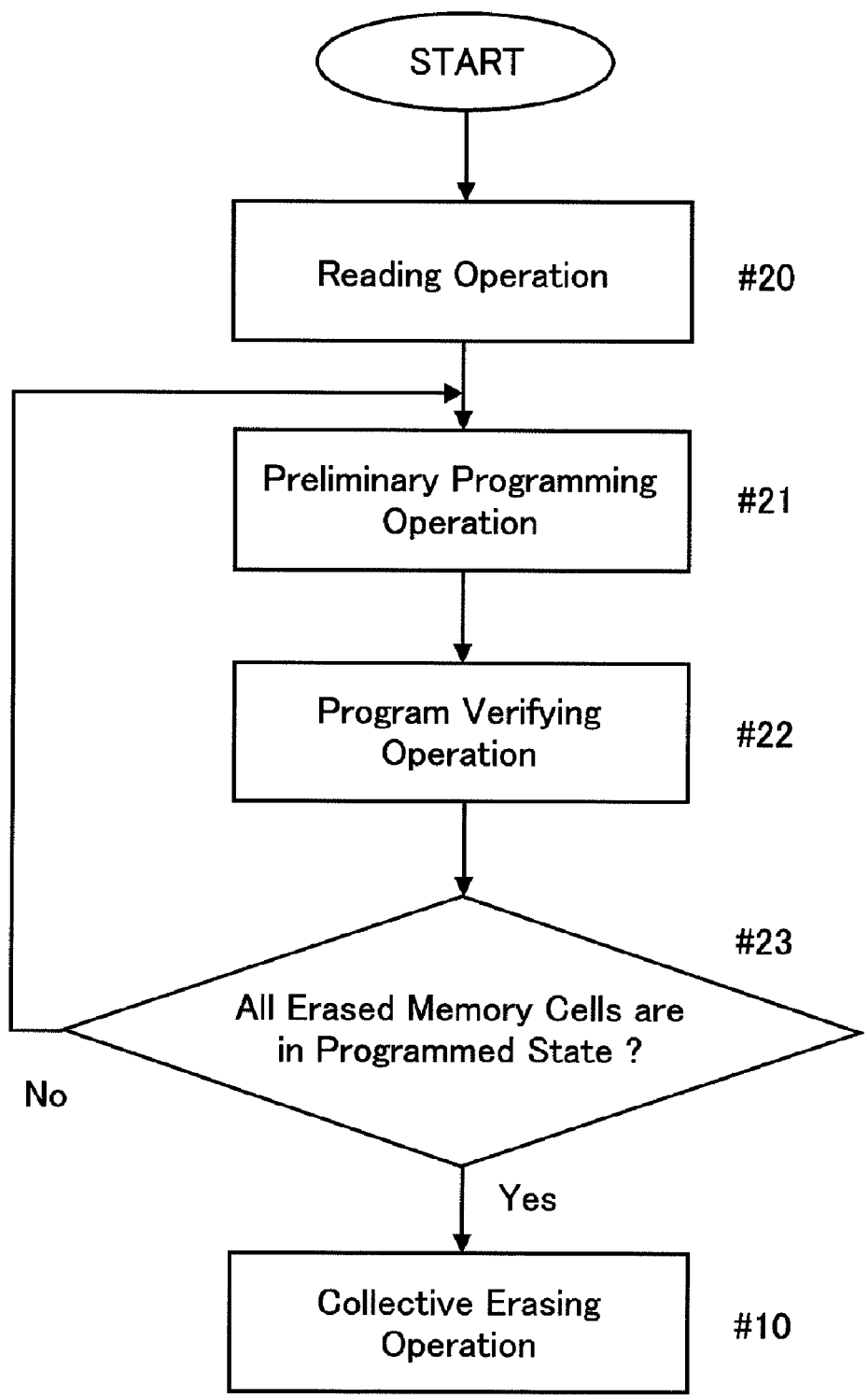
FIG. 12 is a flowchart showing process procedures of a preprocessing operation in a second embodiment of a writing method of the semiconductor memory device according to the present invention.

According to the second embodiment, as shown in FIG. 12, in order to prevent the above variation of the erased states of the variable resistance elements, before the collective erasing operation, the memory cell that is already in the erased state is detected by the reading operation (step #20), and a preliminary programming operation is performed for the memory cell in the erased state (step #21). After the preliminary programming operation, the same program verifying operation that is substantially the same as the reading operation in step #20 is performed (step #22), and the preliminary programming operation in step #21 is repeatedly performed for the memory cell that does not reach the programmed state until it reaches the programmed state and this process is performed for all the memory cells in the erased state (step #23). When the preliminary programming operation for all the memory cells in the erased state is completed (YES in step #23), the process proceeds to the collective erasing operation (#10) shown in FIG. 7. In addition, the reading operation in step #20 and the program verifying operation in step #22 are the same as the reading operation described in the first embodiment.

Here, the preliminary programming operation in step #21 is not necessarily performed for the memory cell individually, and the memory cells in the erased state on the same word line may be programmed at the same time. In this case, in the voltage application condition (in the case of the first embodiment) shown in FIG. 10, the plurality of bit lines may be selected by the column decoder 21 and a function to select certain plurality of bit lines may be added to the column decoder 21.

Another Embodiment

Next, another embodiment of the device of the present invention and the method of the present invention will be described.

Figure 13:
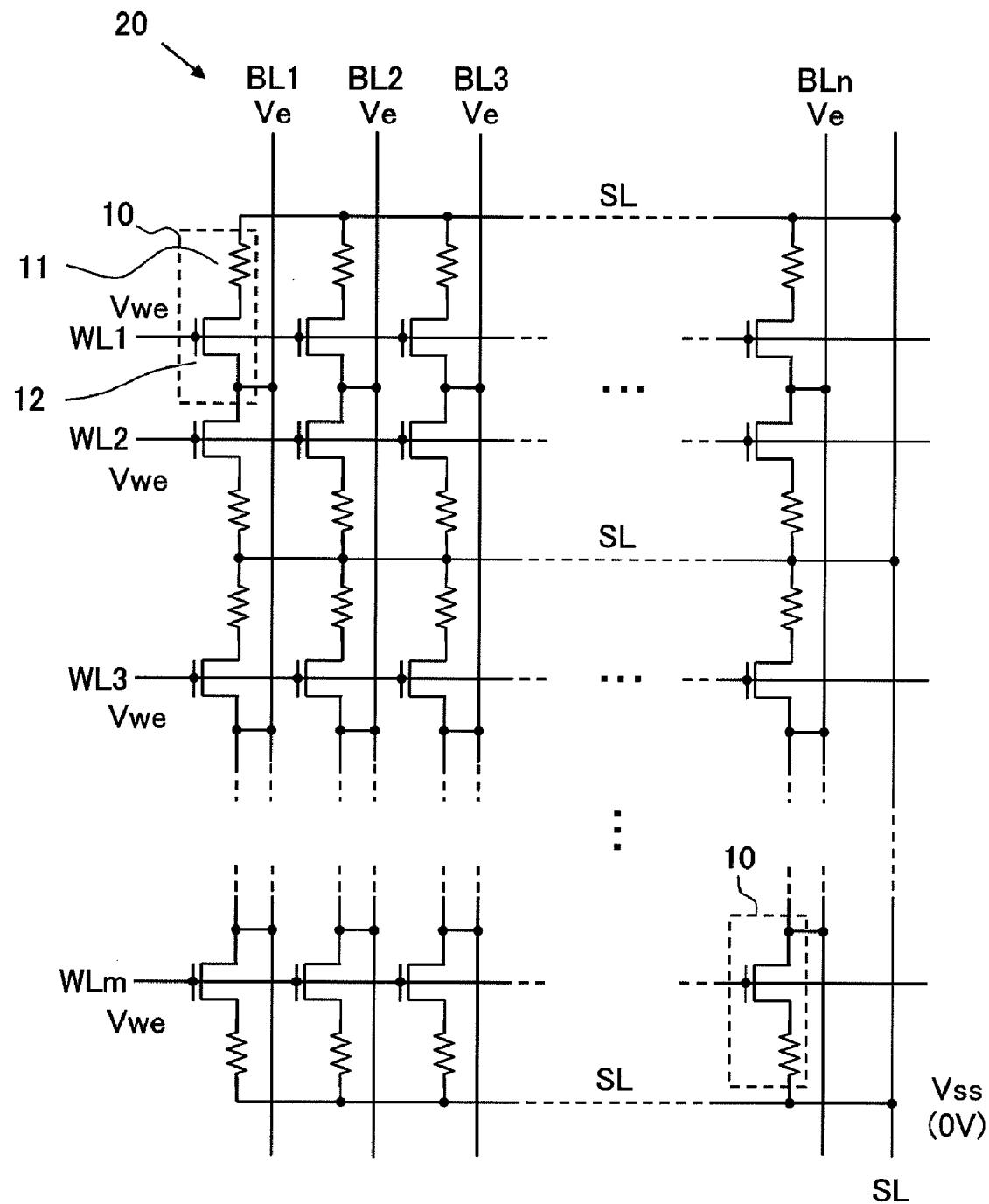
FIG. 13 is a view showing a voltage application condition at the time of a collective erasing operation (second writing operation) in another embodiment of the semiconductor memory device according to the present invention.
Figure 14:
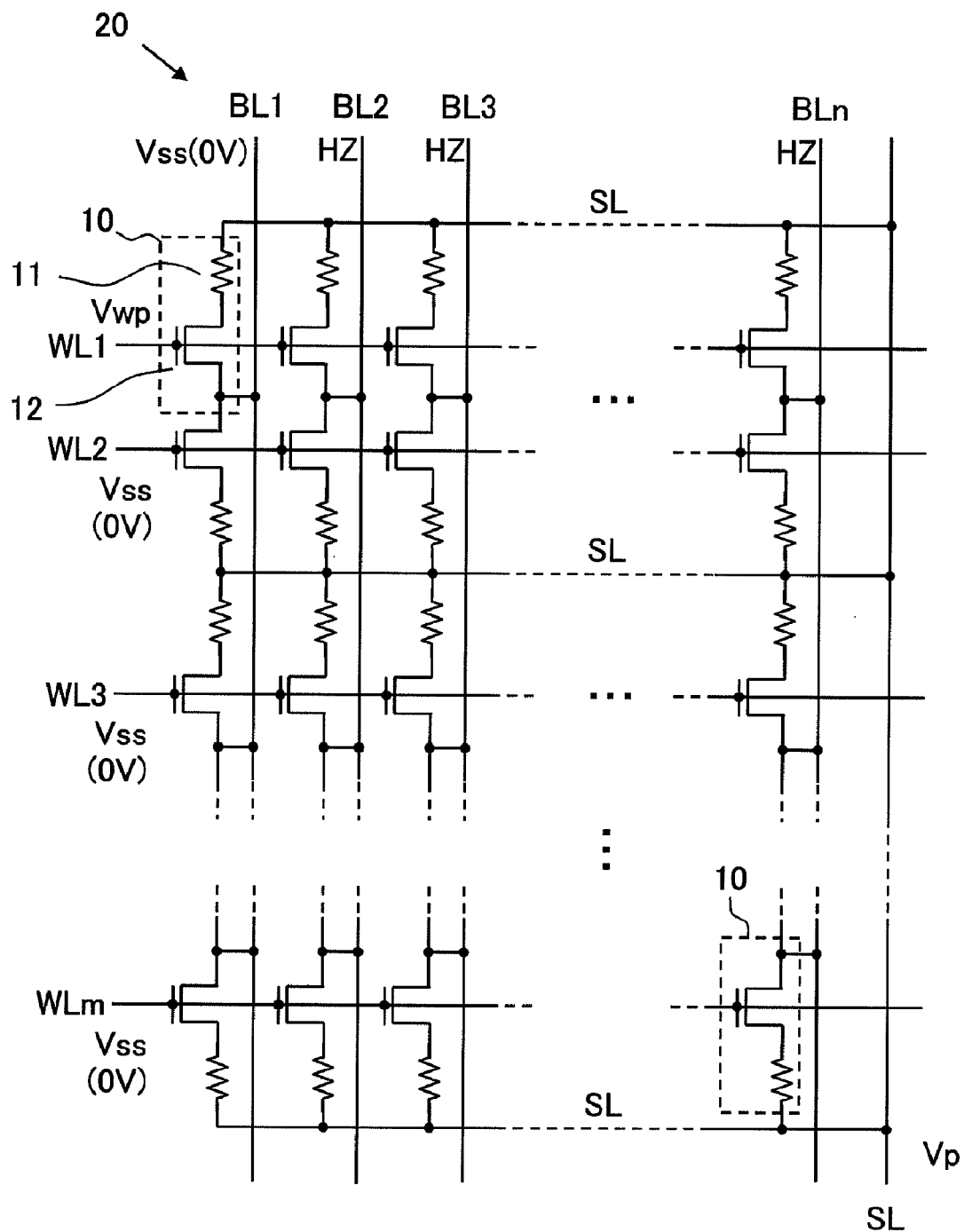
FIG. 14 is a view showing a voltage application condition at the time of a programming operation (first writing operation) in another embodiment of the semiconductor memory device according to the present invention.
Figure 15:
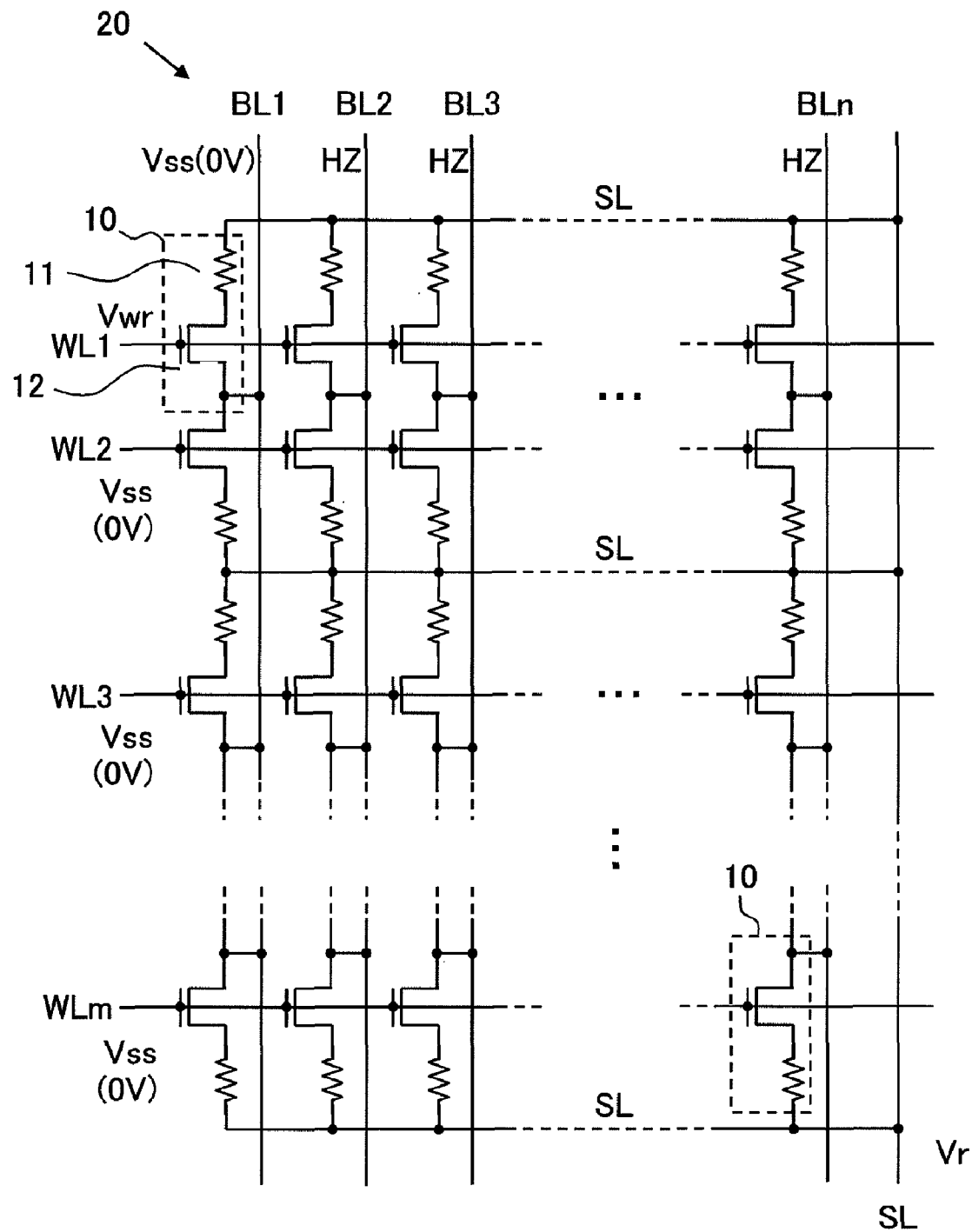
FIG. 15 is a view showing a voltage application condition at the time of a reading operation in another embodiment of the semiconductor memory device according to the present invention.

1. Although the schematic planar constitution and the sectional constitution of the memory cell 10 and the memory cell array 20 are as shown in FIGS. 4 and 5 in the above embodiments, the constitutions of the memory cell 10 and the memory cell array 20 are not limited to the above constitutions. For example, the contact hole 37 formed above the impurity diffusion layer 35 of the selective transistor 12 may be connected to the bit line BL (BL1 to BLn) extending in the column direction (Y direction) instead of the source line, and on the other hand, the upper electrode 15 of the variable resistance element 11 may extend in the row direction (X direction) or the column direction (Y direction) to constitute the source line SL. In this case, one example of the equivalent circuit of the memory cell array 20 is as shown in FIG. 3. In addition, it is to be noted that the voltage polarities applied between the source line SL and the bit line BL are inverted between the upper electrode 15 and the lower electrode 13 of the variable resistance element 11 as compared with the above embodiments. More specifically, the voltage is applied to each of the word lines WL1 to WLm, each of bit lines BL1 to BLn and the source line SL under the voltage application condition shown in FIG. 13 in the collective erasing operation for all the memory cells in the memory cell array, under the voltage application condition shown in FIG. 14 in the programming operation for the memory cell M11 as the selected memory cell, and under the voltage application condition shown in FIG. 15 in the reading operation for the memory cell M11 as the selected memory cell. In any operation, the voltage (erasing operation) applied to each of the bit lines BL1 to BLn or the voltage (programming operation and reading operation) applied to the selected bit line BL1 and the voltage applied to the source line SL are exchanged as compared with the voltage application condition in the first embodiment, and other voltage application conditions are the same as those in the embodiment 1.

2. Although the description has been made of the case where one memory cell array 20 is provided to simplify the description in the above embodiments, the number of the memory cell array 20 is not limited to one and may be more than one, and the effect of the write time reduction in the present invention can be achieved with respect to each memory cell array 20. In addition, the collective erasing operation may be executed targeting the plurality of memory cell arrays.

3. Although the selective transistor composed of the MOS-FET capable of controlling the on state between the source and the drain serving as the three-terminal switching element is used as one example of the switching element capable of turning on and off between the two terminals in the above embodiments, the switching element is not limited to the MOSFET and another three-terminal switching element or two-terminal switching element (diode and the like, for example) may be used. As long as the predetermined potential is arranged at terminals of the switching elements of the selected memory cell and the unselected memory cell by selecting the address of the memory cell, so that the corresponding switching element is turned on and off, and a desired voltage can be applied to both ends of the variable resistance element in the predetermined memory cell, the terminal number and the structure of the switching element and an electric connection between the switching element and the variable resistance element are not limited.

For example, when the diode is used as the switching element, the same effect of the present invention can be achieved by using appropriate potential arrangement. However, it is to be noted that when the diode is used, the same polarity has to be used as the write potential difference.

4. The operation procedures of the writing operation (erasing operation and programming operation), and information such as the specific potential arrangement in each operation procedure in the above embodiments may be stored in the memory of the control circuit in the device of the present invention as a software program or may be stored as the connection state of the specific circuits in the control circuit as a hardware. Alternatively, even when the above information is stored in an external control system of the device of the present invention, as long as the device of the present invention can be operated by the write procedures, the controlling means of the writing operation is not limited to a specific control method.

INDUSTRIAL APPLICABILITY

The semiconductor memory device according to the present invention can be advantageously applied to a semiconductor memory device having a memory cell array in which memory cells each composed of a variable resistance element capable of storing information based on a change of electric resistance in response of voltage application and a switching element are arranged in a row direction and a column direction, and has an advantage of increasing a speed of a writing operation of data in the memory cell array.

The invention claimed is:

1. A semiconductor memory device comprising:
a memory cell array having memory cells each composed of a variable resistance element and a switching element, the variable resistance element having a two-terminal structure and storing information when an electric resistance is changed from a first state to a second state in response to application of a first write voltage of a first polarity applied to both ends and when the electric resistance is changed from the second state to the first state in response to application of a second write voltage of a second polarity different from the first polarity applied to both ends, the switching element having one end electrically connected to one end of the variable resistance element, the memory cells being arranged in a row direction and in a column direction; and
a writing unit configured to select one or more memory cells to be written from the memory cell array, and execute a first writing operation to change the electric resistance from the first state to the second state by applying the first write voltage to both ends of the variable resistance element of each of the selected memory cells and a second writing operation to change the electric resistance from the second state to the first state by applying the second write voltage to both ends of the variable resistance element of each of the selected memory cells,
wherein the variable resistance element is configured such that (i) a same first write current flows in response to the application of the first write voltage and a same second write current flows in response to the application of the second write voltage both when the variable resistance element is in the first state and when the variable resistance element is in the second state and (ii) when a voltage of the first polarity whose absolute value is smaller than that of the first write voltage is applied, and when a voltage of the second polarity whose absolute value is smaller than that of the second write voltage is applied, a current flowing through the variable resistance element varies depending on whether the variable resistance element is in the first state or in the second state,
a second memory cell number, which is a maximum number of the memory cells where the second writing operation is executed by the writing unit at the same time, is greater than a first memory cell number, which is a maximum number of the memory cells where the first writing operation is executed by the writing unit at the same time, in one part or all of the memory cells in the memory cell array,
at least the second memory cell number of the first memory cell number and the second memory cell number is a plural number, and
the second memory cell number is set to be not less than a write current ratio provided by dividing the first write current by the second write current.

2. The semiconductor memory device according to claim 1, wherein
when one of the first memory cell number and the second memory cell number is set to a predetermined value, a memory cell number ratio provided by dividing the second memory cell number by the first memory cell number is set such that a difference between the memory cell number ratio and a write current ratio provided by dividing the first write current by the second write current is minimized.

3. The semiconductor memory device according to claim 1, wherein
each of the first memory cell number and the second memory cell number is a plural number.

4. The semiconductor memory device according to claim 1, wherein
an absolute value of the first write voltage is greater than an absolute value of the second write voltage.

5. The semiconductor memory device according to claim 1, wherein the switching element is a selective transistor composed of an MOSFET, and one end of the switching element electrically connected to one end of the variable resistance element is a source or a drain of the selective transistor.

6. The semiconductor memory device according to claim 5, wherein the memory cell array has a plurality of word lines extending in the row direction and a plurality of bit lines extending in the column direction, a gate of the selective transistor of each of the memory cells in the same row is connected to a common word line, the other end, which is not connected to one of the source and drain of the selective transistor, of the variable resistance element in each of the memory cells in the same column, or the other of the source and drain, which is not connected to the one end of the variable resistance element, of the selective transistor in each of the memory cells in the same column is connected to a common bit line, the selective transistor is an N channel MOSFET, and when the writing unit applies the first write voltage to the selected memory cells, a positive voltage is applied to the other end, which is not connected to the one of the source and drain of the selective transistor, of the variable resistance element in each of the selected memory cells, based on the other of the source and drain, which is not connected to the one end of the variable resistance element, of the selective transistor in each of the selected memory cells.

7. The semiconductor memory device according to claim 1, wherein the writing unit preliminarily executes the first writing operation to set the electric resistance to the second state uniformly before executing the second writing operation for the second memory cell number of the memory cells at the same time, based on previously incorporated write control procedures.

8. The semiconductor memory device according to claim 7, wherein the writing unit executes a reading operation for the second memory cell number of the memory cells to be subjected to the second writing operation at the same time before the preliminary first writing operation to extract the memory cell having the electric resistance not in the second state, and executes the preliminary first writing operation only for the extracted memory cell, based on the previously incorporated write control procedures.

9. A writing method of a semiconductor memory device, the semiconductor memory device comprising a memory cell array having memory cells each composed of a variable resistance element and a switching element, the variable resistance element having a two-terminal structure and storing information when an electric resistance is changed from a first state to a second state in response to application of a first write voltage of a first polarity to both ends and when the electric resistance is changed from the second state to the first state in response to application of a second write voltage of a second polarity different from the first polarity to both ends, the switching element having one end electrically connected to one end of the variable resistance element, the memory cells being arranged in a row direction and in a column direction, wherein the variable resistance element is configured such that (i) a same first write current flows in response to the application of the first write voltage and a same second write current flows in response to the application of the second write voltage both when the variable resistance element is in the first state and when the variable resistance element is in the second state and (ii) when a voltage of the first polarity whose absolute value is smaller than that of the first write voltage is applied, and when a voltage of the second polarity whose absolute value is smaller than that of the second write voltage is applied, a current flowing through the variable resistance element varies depending on whether the variable resistance element is in the first state or in the second state, the method for writing information to one part or all of the memory cells in the memory cell array comprising at least:

a first writing step for executing a first writing operation to change the electric resistance from the first state to the second state by applying the first write voltage to both ends of the variable resistance element, for at least a part of one or more memory cells to be written in the memory cell array; and a second writing step for executing a second writing operation to change the electric resistance from the second state to the first state by applying the second write voltage to both ends of the variable resistance element, for at least another part of the memory cells to be written, wherein a second memory cell number, which is a maximum number of the memory cells where the second writing operation is executed at the same time in the second writing step is greater than a first memory cell number, which is a maximum number of the memory cells where the first writing operation is executed at the same time in the first writing step, and at least the second memory cell number of the first memory cell number and the second memory cell number is a plural number, and the second memory cell number is set to be not less than a write current ratio provided by dividing the first write current by the second write current.

10. The writing method of the semiconductor memory device according to claim 9, wherein when one of the first memory cell number and the second memory cell number is set to a predetermined value, a memory cell number ratio provided by dividing the second memory cell number by the first memory cell number is set such that a difference between the memory cell number ratio and a write current ratio provided by dividing the first write current by the second write current is minimized.

11. The writing method of the semiconductor memory device according to claim 9, further comprising a preliminary first writing step for executing the first writing operation preliminarily to set the electric resistance to the second state uniformly before the second writing step, wherein the preliminary first writing step, the second writing step, and the first writing step are executed sequentially based on previously incorporated write control procedures.

12. The writing method of the semiconductor memory device according to claim 11, further comprising a preliminary reading step for executing a reading operation for the second memory cell number of the memory cells to be subjected to the second writing operation at the same time before the preliminary first writing step to extract a memory cell having the electric resistance not in the second state, wherein the preliminary first writing operation is executed in the preliminary first writing step only for the memory cell extracted in the preliminary reading step.

* * * * *